(12) United States Patent
McNulty et al.

(10) Patent No.: US 9,645,210 B2
(45) Date of Patent: May 9, 2017

(54) METHODS AND APPARATUS FOR THERMAL MANAGEMENT OF AN MRI COMPONENT BY REDUCING EDDY CURRENTS

(71) Applicant: Hyperfine Research, Inc., Guilford, CT (US)

(72) Inventors: Christopher Thomas McNulty, Guilford, CT (US); Michael Stephen Poole, Guilford, CT (US); Gregory L. Charvat, Guilford, CT (US); Matthew Scot Rosen, Somerville, MA (US); Jonathan M. Rothberg, Guilford, CT (US)

(73) Assignee: Hyperfine Research, Inc., Guilford, CT (US)

( * ) Notice: Subject to any disclaimer, the term of this patent is extended or adjusted under 35 U.S.C. 154(b) by 39 days.

(21) Appl. No.: 14/846,042

(22) Filed: Sep. 4, 2015

(65) Prior Publication Data
US 2016/0069971 A1 Mar. 10, 2016

Related U.S. Application Data

(60) Provisional application No. 62/174,666, filed on Jun. 12, 2015, provisional application No. 62/111,320, (Continued)

(51) Int. Cl.
*G01R 33/38* (2006.01)
*G01R 33/36* (2006.01)
(Continued)

(52) U.S. Cl.
CPC ......... *G01R 33/3804* (2013.01); *G01R 33/36* (2013.01); *G01R 33/3614* (2013.01);
(Continued)

(58) Field of Classification Search
CPC .... G01R 33/3804; G01R 33/38; G01R 33/36; G01R 33/546; G01R 33/56; G01R 33/385;
(Continued)

(56) References Cited

U.S. PATENT DOCUMENTS 6,111,412 A * 8/2000 Boemmel .......... G01R 33/3856
324/318
7,397,244 B2 7/2008 Cirel
(Continued)

FOREIGN PATENT DOCUMENTS

WO WO 2009/004521 A1 1/2009

OTHER PUBLICATIONS

Invitation to Pay Additional Fees mailed Oct. 20, 2015 in connection with International Application No. PCT/US2015/048631.
(Continued)

*Primary Examiner* — David M Gray
*Assistant Examiner* — Laura Roth
(74) *Attorney, Agent, or Firm* — Wolf, Greenfield & Sacks, P.C.

(57) ABSTRACT

A thermal management component adapted to cool, when present, at least one component of a magnetic resonance imaging (MRI) system is described. The thermal management component is adapted to reduce or eliminate eddy current production during operation of the MRI system. The thermal management component comprises at least one conduit configured to circulate coolant, and at least one thermally-conductive substrate coupled to the at least one conduit and configured to transfer heat from the at least one component to the coolant when circulated through the at least one conduit, wherein the at least one thermally-conductive substrate is configured to reduce or eliminate eddy current production.

22 Claims, 29 Drawing Sheets

Related U.S. Application Data filed on Feb. 3, 2015, provisional application No. 62/110,049, filed on Jan. 30, 2015, provisional application No. 62/046,814, filed on Sep. 5, 2014.

(51) Int. Cl.

| | | |
|---|---|---|
| *G01R 33/385* | (2006.01) | |
| *G01R 33/44* | (2006.01) | |
| *G01R 33/58* | (2006.01) | |
| *G01R 33/48* | (2006.01) | |
| *H01F 7/02* | (2006.01) | |
| *H01F 7/06* | (2006.01) | |
| *G01R 33/381* | (2006.01) | |
| *G01R 33/383* | (2006.01) | |
| *G01R 33/3875* | (2006.01) | |
| *G01R 33/54* | (2006.01) | |
| *G01R 33/56* | (2006.01) | |
| *G01R 33/34* | (2006.01) | |
| *G01R 33/422* | (2006.01) | |

(52) U.S. Cl.
CPC ........... *G01R 33/38* (2013.01); *G01R 33/381* (2013.01); *G01R 33/3802* (2013.01); *G01R 33/383* (2013.01); *G01R 33/385* (2013.01); *G01R 33/3806* (2013.01); *G01R 33/3852* (2013.01); *G01R 33/3854* (2013.01); *G01R 33/3856* (2013.01); *G01R 33/3858* (2013.01); *G01R 33/3875* (2013.01); *G01R 33/445* (2013.01); *G01R 33/48* (2013.01); *G01R 33/543* (2013.01); *G01R 33/546* (2013.01); *G01R 33/56* (2013.01); *G01R 33/5608* (2013.01); *G01R 33/58* (2013.01); *H01F 7/02* (2013.01); *H01F 7/06* (2013.01); *G01R 33/34007* (2013.01); *G01R 33/422* (2013.01)

(58) Field of Classification Search
CPC ............ G01R 33/5608; G01R 33/3858; G01R 33/3802; G01R 33/3806; G01R 33/543; G01R 33/3852; G01R 33/3854; G01R 33/58; G01R 33/3856; G01R 33/48; G01R 33/381; G01R 33/383; G01R 33/3875; G01R 33/3614; G01R 33/445; G01R 33/422; G01R 33/34007; H01F 7/02; H01F 7/06
See application file for complete search history.

(56) References Cited

U.S. PATENT DOCUMENTS

| | | |
|---|---|---|
| 7,759,935 B2 | 7/2010 | Deviews et al. |
| 2002/0008516 A1 | 1/2002 | Dietz et al. |
| 2005/0035764 A1 | 2/2005 | Mantone et al. |
| 2005/0093543 A1* | 5/2005 | Arik .................. G01R 33/3856 324/318 |
| 2005/0168222 A1* | 8/2005 | Arz .................... G01R 33/3856 324/318 |
| 2005/0179512 A1 | 8/2005 | Weyers et al. |
| 2006/0066309 A1 | 3/2006 | Arik et al. |
| 2009/0120615 A1 | 5/2009 | Icoz et al. |
| 2016/0225504 A1* | 8/2016 | Hori ......................... H01F 6/06 |

OTHER PUBLICATIONS

International Search Report and Written Opinion mailed Jan. 6, 2016 in connection with International Application No. PCT/US2015/048631.

\* cited by examiner

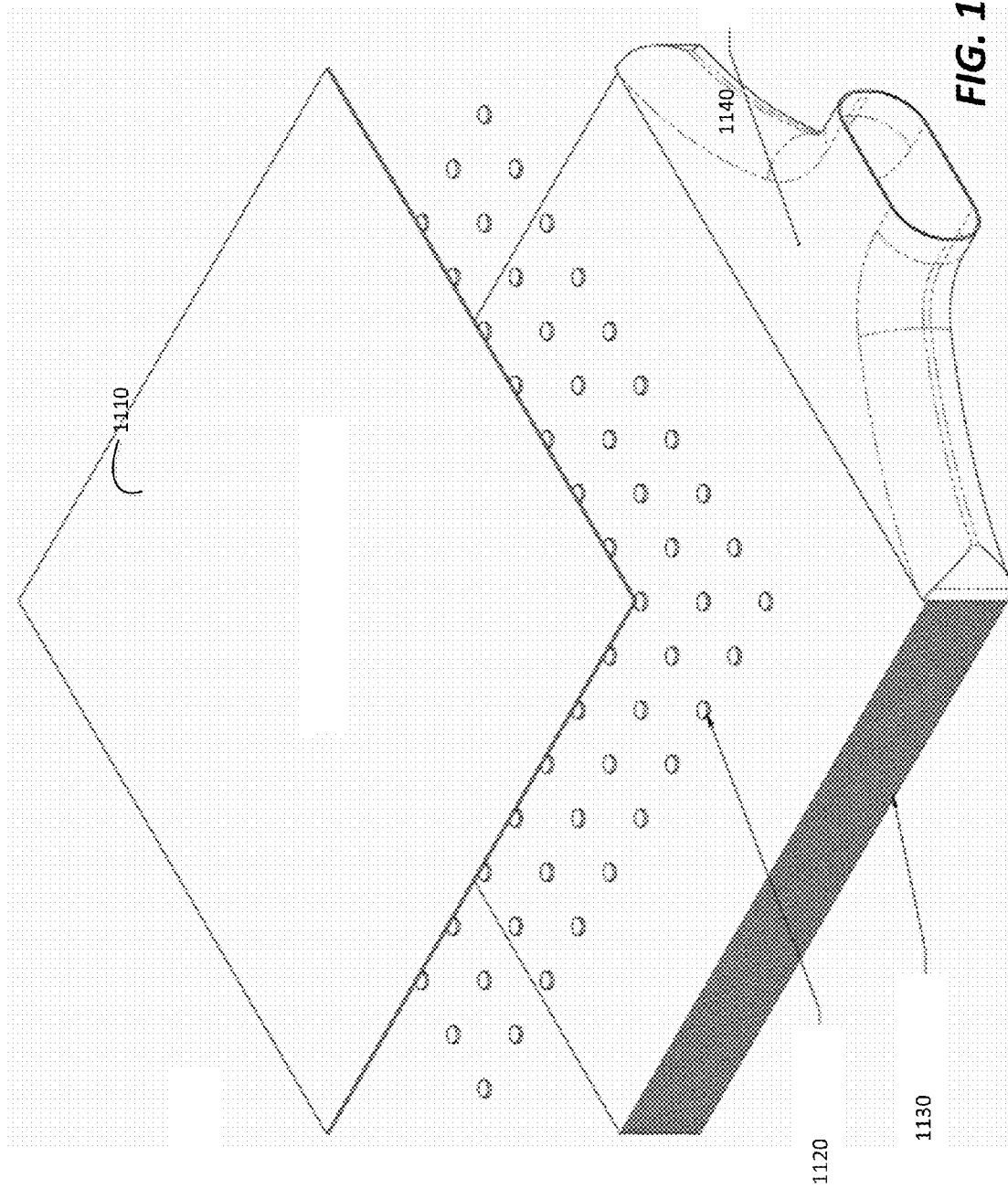

METHODS AND APPARATUS FOR THERMAL MANAGEMENT OF AN MRI COMPONENT BY REDUCING EDDY CURRENTS

RELATED APPLICATIONS

This application claims priority under 35 U.S.C. §119(e) to U.S. Provisional Patent Application Ser. No. 62/046,814, filed Sep. 5, 2014 and entitled "Low Field Magnetic Resonance Imaging Methods and Apparatus," U.S. Provisional Patent Application Ser. No. 62/111,320, filed Feb. 3, 2015 and entitled "Thermal Management Methods and Apparatus," U.S. Provisional Patent Application Ser. No. 62/110,049, filed Jan. 30, 2015 and entitled "Noise Suppression Methods and Apparatus," and U.S. Provisional Patent Application Ser. No. 62/174,666, filed Jun. 12, 2015 and entitled "Automatic Configuration of a Low Field Magnetic Resonance Imaging System," each of which is herein incorporated by reference in its entirety.

BACKGROUND

Magnetic resonance imaging (MRI) provides an important imaging modality for numerous applications and is widely utilized in clinical and research settings to produce images of the inside of the human body. As a generality, MRI is based on detecting magnetic resonance (MR) signals, which are electromagnetic waves emitted by atoms in response to state changes resulting from applied electromagnetic fields. For example, nuclear magnetic resonance (NMR) techniques involve detecting MR signals emitted from the nuclei of excited atoms upon the re-alignment or relaxation of the nuclear spin of atoms in an object being imaged (e.g., atoms in the tissue of the human body). Detected MR signals may be processed to produce images, which in the context of medical applications, allows for the investigation of internal structures and/or biological processes within the body for diagnostic, therapeutic and/or research purposes.

MRI provides an attractive imaging modality for biological imaging due to the ability to produce non-invasive images having relatively high resolution and contrast without the safety concerns of other modalities (e.g., without needing to expose the subject being imaged to ionizing radiation, such as x-rays, or introducing radioactive material to the body). Additionally, MRI is capable of capturing information about structures and/or biological processes that other modalities are not well suited to acquire or are incapable of acquiring. For example, MRI is particularly well suited to provide contrast among soft tissues. However, there are a number of drawbacks to conventional MRI techniques that, for a given imaging application, may include the relatively high cost of the equipment, limited availability (e.g., difficulty and expense in gaining access to clinical MRI scanners), the length of the image acquisition process, etc.

The trend in clinical MRI has been to increase the field strength of MRI scanners to improve one or more of scan time, image resolution, and image contrast, which in turn drives up costs of MRI imaging. The vast majority of installed MRI scanners operate using at least at 1.5 or 3 tesla (T), which refers to the field strength of the main magnetic field B0 of the scanner. A rough cost estimate for a clinical MRI scanner is on the order of one million dollars per tesla, which does not even factor in the substantial operation, service, and maintenance costs involved in operating such MRI scanners.

Additionally, conventional high-field MRI systems typically require large superconducting magnets and associated electronics to generate a strong uniform static magnetic field (B0) in which a subject (e.g., a patient) is imaged. Superconducting magnets further require cryogenic equipment to keep the conductors in a superconducting state. The size of such systems is considerable with a typical MRI installment including multiple rooms for the magnetic components, electronics, thermal management system, and control console areas, including a specially shielded room to isolate the magnetic components of the MRI system. The size and expense of MRI systems generally limits their usage to facilities, such as hospitals and academic research centers, which have sufficient space and resources to purchase and maintain them. The high cost and substantial space requirements of high-field MRI systems results in limited availability of MRI scanners. As such, there are frequently clinical situations in which an MRI scan would be beneficial, but is impractical or impossible due to the above-described limitations and as discussed in further detail below.

SUMMARY

The inventors have developed thermal management methods and apparatus to remove heat from one or more components of an MRI system. Some embodiments include a thermal management component adapted to cool, when present, at least one component of a magnetic resonance imaging (MRI) system, the thermal management component adapted to reduce or eliminate eddy current production during operation of the MRI system, the thermal management component comprising at least one conduit configured to circulate coolant, and at least one thermally-conductive substrate coupled to the at least one conduit and configured to transfer heat from the at least one component to the coolant when circulated through the at least one conduit, wherein the at least one thermally-conductive substrate is configured to reduce or eliminate eddy current production.

Some embodiments include a method of cooling at least one component of a magnetic resonance imaging (MRI) system adapted to reduce or eliminate eddy current production during operation of the MRI system, the method comprising operating the at least one magnetic component thermally coupled to a thermal management component, the thermal management component comprising at least one thermally-conductive substrate configured to transfer heat away from the at least one magnetic component, wherein the at least one thermally-conductive substrate is configured to reduce or eliminate eddy current production, and circulating coolant through the thermal management component during operation of the at least one magnetic component to transfer heat from the substrate to the coolant.

Some embodiments include a laminate panel having one or more magnetic components fabricated thereon and having an integrated thermal management component, comprising at least one first laminate layer and at least one second laminate layer, each having at least a portion of at least one magnetic component patterned thereon, at least one thermal management layer provided between the at least one first laminate layer and the at least one second laminate layer, the at least one thermal management layer capable of allowing coolant to flow between the at least one first laminate layer and the at least one second laminate layer to remove heat.

Some embodiments include a method of cooling a laminate panel having one or more magnetic components fabricated thereon using an integrated thermal management component, the method comprising causing a coolant to flow through at least one thermal management layer of the laminate panel provided between at least one first laminate layer and at least one second laminate layer of the laminate panel, each of the first laminate layer and the second laminate layer having at least a portion of at least one magnetic component patterned thereon.

BRIEF DESCRIPTION OF THE DRAWINGS

Various aspects and embodiments of the disclosed technology will be described with reference to the following figures. It should be appreciated that the figures are not necessarily drawn to scale.

FIG. 11 illustrates another an integrated thermal management component in accordance with some embodiments;

DETAILED DESCRIPTION

Figure 1:
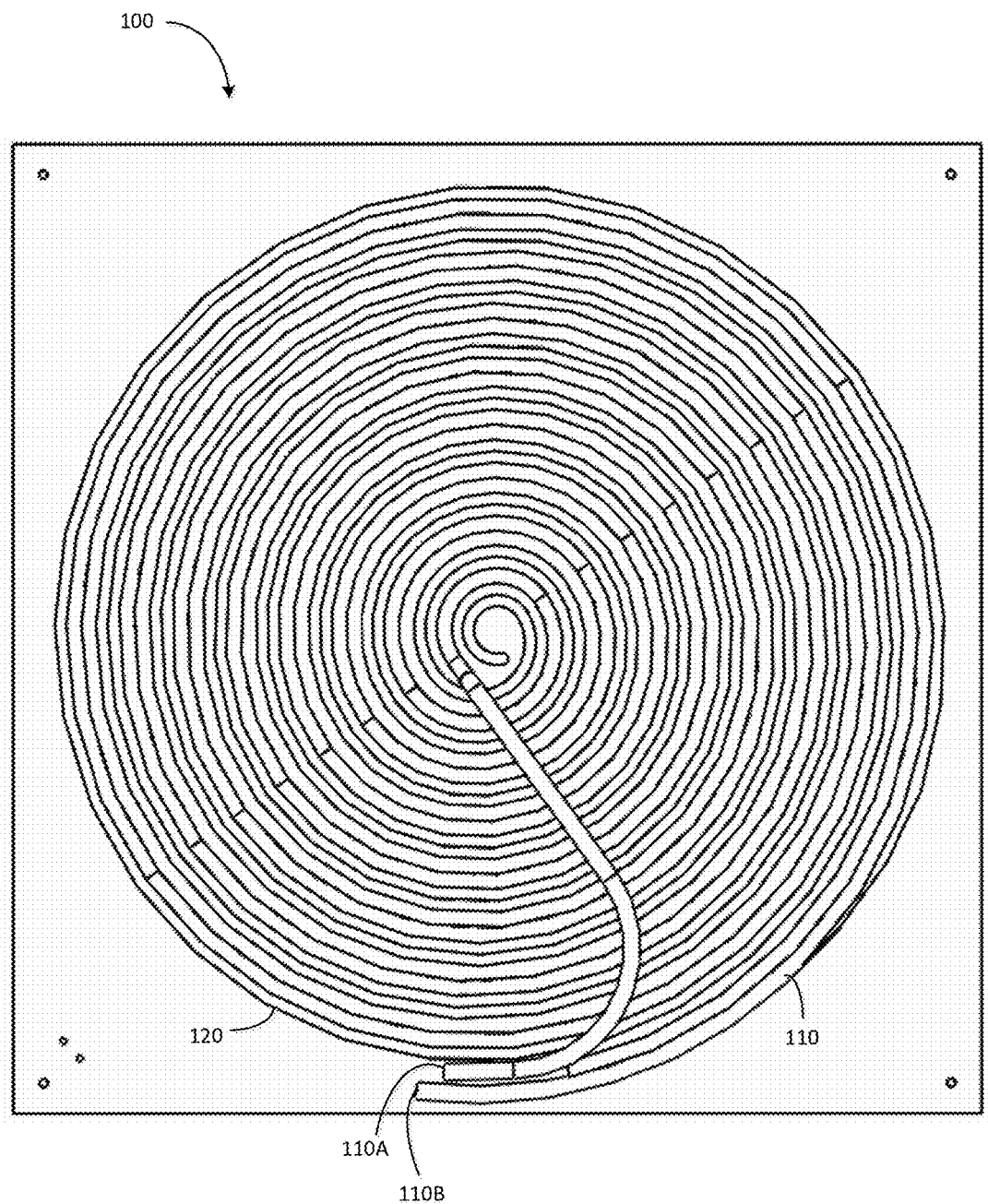
FIG. 1 illustrates a top view of a thermal management component, in accordance with some embodiments.

The MRI scanner market is overwhelmingly dominated by high-field systems, and is exclusively so for medical or clinical MRI applications. As discussed above, the general trend in medical imaging has been to produce MRI scanners with increasingly greater field strengths, with the vast majority of clinical MRI scanners operating either at 1.5 T or 3 T, with higher field strengths of 7 T and 9 T used in research settings. As used herein, "high-field" refers generally to MRI systems presently in use in a clinical setting and, more particularly, to MRI systems operating with a main magnetic field (i.e., a B0 field) at or above 1.5 T, though clinical systems operating between 0.5 T and 1.5 T are generally also considered "high-field." By contrast, "low-field" refers generally to MRI systems operating with a B0 field of less than or equal to approximately 0.2 T.

The appeal of high-field MRI systems includes improved resolution and/or reduced scan times relative to lower field systems, motivating the push for higher and higher field strengths for use in clinical and medical MRI applications. As discussed above, however, increasing the field strength of MRI systems increases the cost and complexity of MRI scanners, thus limiting their availability and preventing their use as a general-purpose and/or generally-available imaging solution. As discussed above, significant contributors to the high cost of high-field MRI are expensive superconducting wires and the cryogenic cooling systems needed to keep the wires in a superconducting state. For example, the B0 magnet for high field MRI systems frequently employ superconducting wire that is not only itself expensive, but requires expensive and complicated cryogenic equipment to maintain the superconducting state.

Low-field MRI presents an attractive imaging solution, providing a relatively low cost, high availability alternative to high-field MRI that can eliminate many of the factors contributing to the expense, complexity and lack of availability of high-field MRI. For example, magnetic components of low-field MRI systems generally do not employ superconducting materials and instead often employ more conventional conducting materials (e.g., copper, aluminum, etc.) that generate heat when operated so that thermal management is typically required to dissipate heat generated by the MRI system (e.g., the magnetic components of the system). The inventors have developed thermal management systems that facilitate relatively low cost, low complexity systems.

The magnetic components of an MRI system, when operated, induce current (eddy currents) in conductive materials like aluminum, copper, stainless steel, etc. that are proximate the magnetic components (e.g., the B0 magnet, gradient coils, etc.). These eddy currents can negatively impact image quality, for example, by interfering with the magnetic fields generated by the MRI system. The inventors have recognized that thermal management components can be a significant source of such eddy currents and can contribute significantly to image degradation. For example, a low-field MRI system may utilize permanent magnets and/or relatively high power electromagnets that can produce several kilowatts of heat. Proper and safe operation of such magnetic components therefore typically requires cooling. A thermal management system capable of cooling such a system typically will be constructed, in part, from thermally conductive material that is also electrically conductive and therefore susceptible to eddy currents that can cause a reduction in image quality. To address this issue, the inventors have developed techniques for providing thermal management components configured to reduce or eliminate eddy currents that can negatively affect image quality or otherwise negatively impact the operation of the low-field MRI system.

Some techniques described herein facilitate the provision and use of a thermal management component configured to transfer heat away from heat producing components (e.g., magnetic components, amplifiers, power supplies, etc.) while reducing or eliminating eddy currents induced in the thermal management component. As a result, degradation in the operation of the system being controlled may be reduced. For example, a thermal management component having a reduced ability to generate eddy currents may facilitate cooling of components of an MRI system without, or with reduced, consequent degradation of image quality.

According to some embodiments, eddy current reduction is achieved, at least in part, by partitioning electrically conductive components to reduce the area and/or volume of conductive regions of the thermal management component susceptible to eddy current production when, for example, in the proximity of the operating magnetics of a low-field MRI system. The terms, used interchangeably, "electrically partitioning" or "partitioning electrically" refer to any technique that partitions an electrically conductive region into smaller electrically conductive regions to reduce the magnitude or amount of eddy currents that can be induced (e.g., by reducing the size of contiguous electrically conductive regions). For example, an electrically conductive region can be cut or otherwise manufactured to partition the region into smaller conductive regions to reduce the size of current loops that can be induced.

According to some embodiments, a thermally and electrically conductive substrate (e.g., a cooling plate) is electrically partitioned by producing the thermally conductive portions in a spiral shape to reduce the size of contiguous electrically conductive regions that can support current loops (e.g., by spirally cutting or otherwise manufacturing the substrate to produce a spiral shape of thermally conductive material). It should be appreciated that partitioning an electrically conductive component can be achieved in other ways, for example, by using cuts of different shapes (e.g., linear cuts) or manufacturing the component in other ways or shapes to partition electrically conductive regions of the thermal management component. Further methods for electrically partitioning include partitioning an electrically conductive component with insulating material to reduce the size of contiguous electrically conducting regions. Techniques for electrically partitioning a component may also be combined in any way, some examples of which are described in further detail below.

According to some embodiments, one or more thermal management components conventionally implemented using thermally and electrically conductive material (e.g., copper, aluminum, etc.) may be implemented instead using a thermally conductive, but electrically non-conductive material to eliminate eddy currents in this respect. For example, one or more thermal management components may be constructed using a thermally conductive polymer (e.g., CoolPoly®) that is not susceptible to eddy currents, some embodiments of which are discussed in further detail below.

Some examples of low-field MRI systems for which thermal management techniques described herein are suitable are described in further detail below, including the low-field MRI systems described in co-filed patent application Ser. No. 14/845,652, filed Sep. 4, 2015 and titled "Low Field Magnetic Resonance Imaging Methods and Apparatus," which is herein incorporated by reference in its entirety. While techniques for thermal management described herein may be well-suited for low-field MRI, it should be appreciated that concepts described herein may be used in the high-field context to provide cooling for one or more magnetic components, or to otherwise draw heat away from the equipment, as the aspects are not limited in this respect.

The above incorporated co-filed application also describes a number of exemplary low-field MRI systems in which one or more magnetic components are fabricated using laminate techniques to produce a laminate panel having integrated magnetic component(s) or portions thereof. The inventors have developed techniques for integrating a thermal management component within the layers of a laminate panel to facilitate cooling of magnetic components fabricated thereon. According to some embodiments, one or more cooling layers are interleaved with layers upon which one or more magnetic components (or portions thereof) are fabricated so that a resulting laminate panel includes an integrated thermal management component.

Following below are more detailed descriptions of various concepts related to, and embodiments of, methods and apparatus for thermal management, including for low-field magnetic resonance applications such as low-field MRI. It should be appreciated that various aspects described herein may be implemented in any of numerous ways. Examples of specific implementations are provided herein for illustrative purposes only. In addition, the various aspects described in the embodiments below may be used alone or in any combination, and are not limited to the combinations explicitly described herein.

As described above, a low-field MRI system designed in accordance with the techniques described herein may include one or more thermal management components configured to facilitate the transfer of thermal energy generated by one or more components of the low-field MRI system away from those components. For example, one or more thermal management components may be integrated with or be arranged in close proximity to MRI components that generate heat including, but not limited to, $B_0$ coils, gradient coils, transmit/receive coils, gradient power amplifiers, transmit RF power amplifiers, receive RF pre-amplifiers, magnet power supplies, etc.

FIG. 1 shows a top view of thermal management component 100 configured to reduce eddy current production, in accordance with some embodiments. Thermal management component 100 includes a conduit 110 made of thermally-conductive material (e.g., copper) or electrically non-conductive material (e.g., thin-walled plastic pipe that is not susceptible to eddy currents) that allows coolant to be circulated. Thermal management component 100 also includes a substrate 120 thermally coupled to conduit 110 to transfer heat from one or more heat sources to coolant circulated through conduit 110. A substrate refers to any generally thermally-conductive component configured to remove heat from a heat source. Substrate 120 is electrically partitioned to reduce the amount of eddy currents induced in the substrate when, for example, in the presence of the operating magnetic components of a low-field MRI system, as discussed in further detail below.

According to some embodiments, conduit 110 is formed by a thermally conductive tube and substrate 120 is formed by a thermally and electrically conductive material (e.g., an aluminum plate). Conduit 110 may thermally couple to substrate 120 by being affixed to the surface of the substrate or positioned within the substrate, examples of which are described in further detail below. Thermal management component 100 provides cooling by being positioned to thermally couple with one or more heat producing components (e.g., magnetic components, amplifiers, power supplies, etc.) of a low field MRI system, various examples of which are described in further detail below.

Conduit 110 may be any component capable of circulating coolant and can be made of any desired material. Similarly, substrate 120 may be formed using any thermally conductive material capable of transferring heat from one or more heat sources to coolant circulating via conduit 110. As one example, thermal management component 100 may comprise a copper (or other material) conduit or pipe 110 configured in a spiral shape and affixed to, or provided within, a spiral shaped (e.g., via a spiral cut) aluminum (or other material) substrate 120. However, it should be appreciated that metal or non-metal materials other than copper and aluminum may alternatively be used to provide heat transfer, and embodiments are not limited in this respect. According to some embodiments, the conduit is not a separate component (e.g., a separate tube or pipe is not provided) but is fabricated within the substrate. For example, the conduit may be formed as a bore within the substrate that forms a "tunnel" within the substrate of any desired shape (e.g., a spiral shaped tunnel formed within the substrate itself). The conduit can be provided in any suitable way that allows coolant to circulate and thermally couple to the substrate.

According to some embodiments, thermal management component 100 is designed to be positioned to thermally couple to one or more laminate panels to transfer heat away from the laminate panel(s) during operation. As discussed in the above incorporated co-filed application, the term "laminate" refers herein to a plurality of superposed layers, typically involving at least one or more non-conductive layers and one or more conductive layers. Unless otherwise specified, the term "laminate" is generic to the types of materials used and indicates the affixing of multiple layers together, but does not specify any particular type of material or arrangement of materials used to produce the layers. The term "panel" generally describes a structure resulting from a laminate of multiple laminate layers and can be of any shape or size. The laminate panels discussed herein may have fabricated thereon (e.g., patterned on one or more conductive layers) any one or combination of magnetic components, or portions thereof, using any suitable technique (e.g., using any of the techniques described in the above incorporated co-filed application). For example, one or more B0 coils, one or more gradient coils, one or more transmit/receive coils, and/or one or more shim coils, or any desired portions or combinations thereof may be fabricated on a single laminate panel or distributed between multiple laminate panels as desired.

According to some embodiments, thermal management component 100 is designed to thermally couple with one or more components not produced in laminate panel form (e.g., one or more magnetic components produced using conventional manufacturing techniques such as a wound B0 coil), and in other embodiments is designed to couple to both laminate panel and non-laminate panel components. According to some embodiments, conduit 110 is a copper tube configured to connect to a fluid source (e.g., a water hook-up or fluid reservoir) at either end 110A or 110B and deposit the fluid via the other. The fluid running through conduit 110 absorbs heat, via substrate 120 (e.g., a spirally cut cold plate), from the one or more components to which it is thermally coupled and carries it away to be exchanged and/or deposited elsewhere.

The inventors have appreciated that the spirally cut conducting material of the substrate mitigates or eliminates eddy currents that often degrade the performance of an MRI system, for example, by interfering with the magnetic fields of the low-field MRI system, thus resulting in a reduction in image quality. In particular, a spirally cut substrate electrically partitions the substrate into smaller regions to reduce the eddy currents that can be induced in the substrate. It should be appreciated that the substrate can be electrically partitioned in numerous ways and a spirally cut substrate is only one non-limiting method of doing so, some further examples of which are discussed in further detail below. Due to its spiral shape, thermal management component 100 may be particularly well-suited for removing heat from components that include time varying magnetic fields, such as those present in magnetic components of an MRI system. However, thermal management component 100 may be utilized in connection with other types of components, as the spiral shaped geometry is not limited for use with any particular component or system for which cooling is desired.

It should be appreciated that thermal management component 100 can be used in conjunction with any coolant, including any fluid or combination of fluids (e.g., various mixtures, emulsions or slurries of different fluids, compounds and/or particles), and including fluids in liquid or gas state, or phase change material (e.g., heat pipe), capable of absorbing and transporting heat. The ability to utilize water may facilitate deployment of a generally portable or "cartable" low-field MRI system having a thermal management component that can be connected to and utilize available water sources (e.g., any of the numerous cold water hook-ups available not only throughout medical facilities, but at small clinics, mobile facilities and elsewhere). However, according to some embodiments, the fluid source is internal to the system, such as a reservoir through which the coolant can be circulated, as discussed in further detail below. Additionally, other cooling fluids such as liquid nitrogen, outgassing of solid carbon dioxide, refrigerated and compressed air, etc., may also be utilized by thermal management component 100, as the aspects are not limited in this respect.

In FIG. 1, the conduit 110 includes outlets 110A and 110B through which liquid (e.g., water), gas (e.g., air), or any other suitable coolant enters/exits conduit 110. In the embodiment shown in FIG. 1, both outlets 110A and 110B are shown as being located in close proximity to each other to facilitate connection to a source of coolant. To facilitate this arrangement of outlets, a portion of conduit 110 is formed on top of one side of the spiral of conduit 110 to connect the innermost portion of the spiral with the outlet 110A. Such arrangement may limit use of the thermal management component 100 to one-sided heat-transfer applications. Other arrangements are discussed in further detail below.

Figure 2:
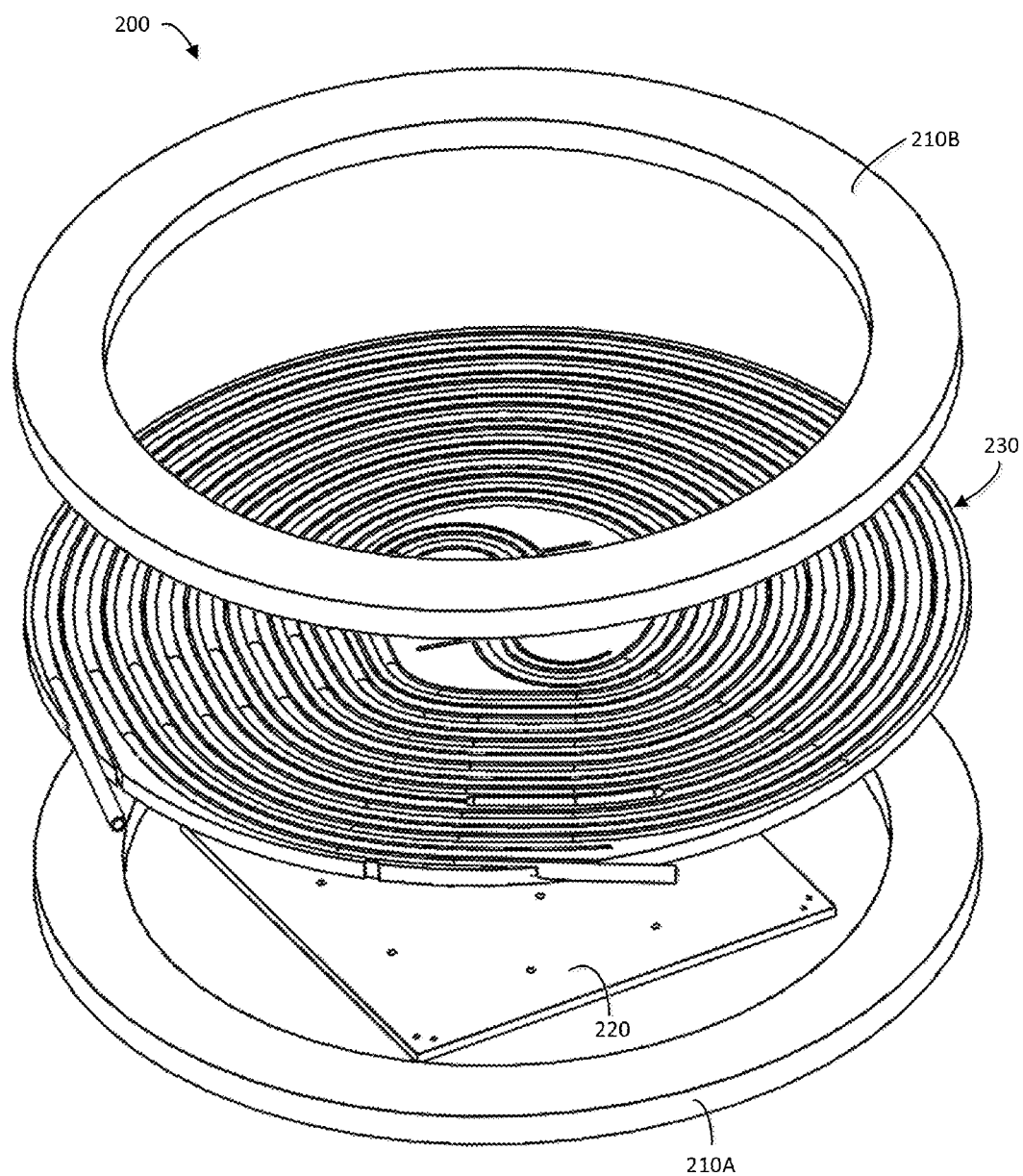
FIG. 2 illustrates an exploded view of a thermal management component in combination with magnetics components of a low-field MRI system, in accordance with some embodiments.

FIG. 2 illustrates an exploded view of a system component 200 for a low-field MRI system including magnetic components and a thermal management component, in accordance with some embodiments. System component 200 includes a pair of $B_0$ coils 210A, 210B configured to generate a main magnetic field for the MRI system, and a laminate panel 220, on which one or more additional magnetics components (e.g., B0 coils such as correction or shim coils, gradient coils, Tx/Rx coils, etc.) are formed. It should be appreciated that laminate panel 220 is illustrated schematically to be representative of any desired laminate panel having any number of coils of any type distributed over any number of laminate layers.

System component 200 also includes thermal management component 230 arranged between $B_0$ coils 210A, 210B. Although only a single laminate panel 220 is shown, it should be appreciated that any suitable number of laminate panels 220 arranged in any suitable way to produce desired magnetic fields may alternatively be used. For example, in some embodiments a second laminate panel 220 having magnetics components formed thereon may be arranged between $B_0$ coil 210B and thermal management component 230. Thermal management component 230 is arranged to thermally couple with the magnetic components (e.g., wound coils 210A, 210B and laminate panel 220) to draw heat away from these components during operation.

As shown, system component 200 includes a "hybrid" design for the magnetics components, where a portion of the magnetics components are fabricated using laminate techniques, and another portion of the magnetics components are fabricated using conventional techniques (e.g., wound wire $B_0$ coils). Alternatively, in some embodiments, all magnetics components may be fabricated using laminate techniques, and the thermal management component 230 described herein may also be used with such embodiments to provide thermal cooling, as discussed in more detail below. It should be appreciated that thermal management components described herein may be used to cool any combination of coils, laminate panels and/or other magnetic sources (e.g., ferromagnetic materials), as the thermal management techniques are not limited for use with any particular implementation or type of magnetic components or other heat producing components.

Figure 3:
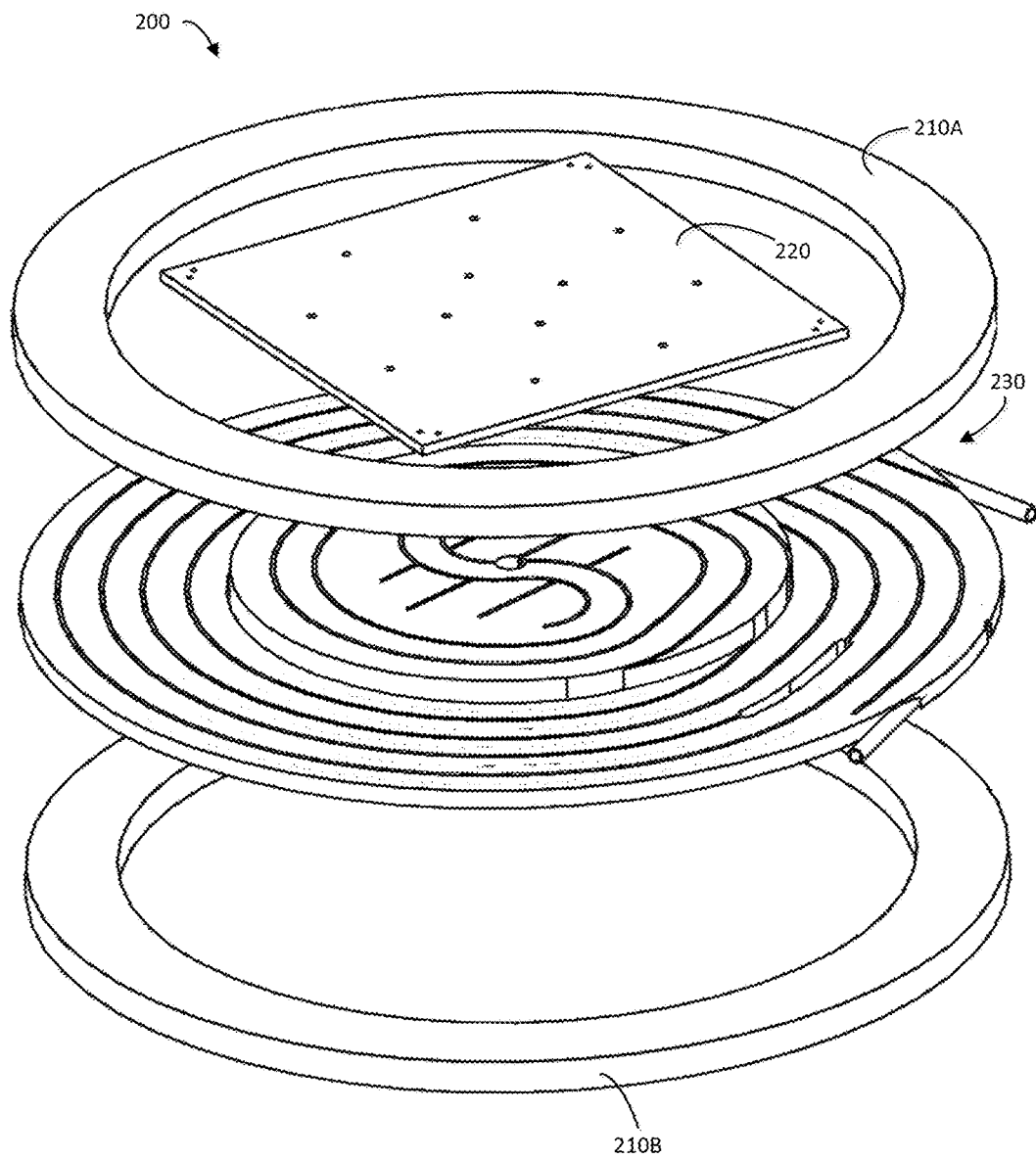
FIG. 3 illustrates an exploded view of a thermal management component in combination with magnetics components of a low-field MRI system, in accordance with some embodiments.

FIG. 3 shows an exploded view of the opposing side of system component 200 illustrated in FIG. 2. Shown more clearly in FIG. 3 are a plurality of "cuts" formed in thermal management component 230. A cut can take any form or shape that disturbs the continuity of an electrically-conductive surface or volume to reduce the size of a region in which current loops can be induced. As discussed in more detail below, the cuts are introduced into the substrate of the thermal management component 230 to reduce eddy currents from forming in the substrate material during operation of the system component 200. Because eddy currents flow in closed loops, the cuts are strategically placed at locations in the substrate to limit the amount of contiguous substrate material, thereby mitigating the formation of eddy currents in the substrate. In particular, smaller contiguous conductive regions result in eddy currents being induced in smaller circles or loops, reducing both the amplitude and decay time of the secondary magnetic fields generated by the eddy currents, thus reducing the disruption to the magnetic fields of the low-field MRI system and the consequent impact on image quality.

Figure 4:
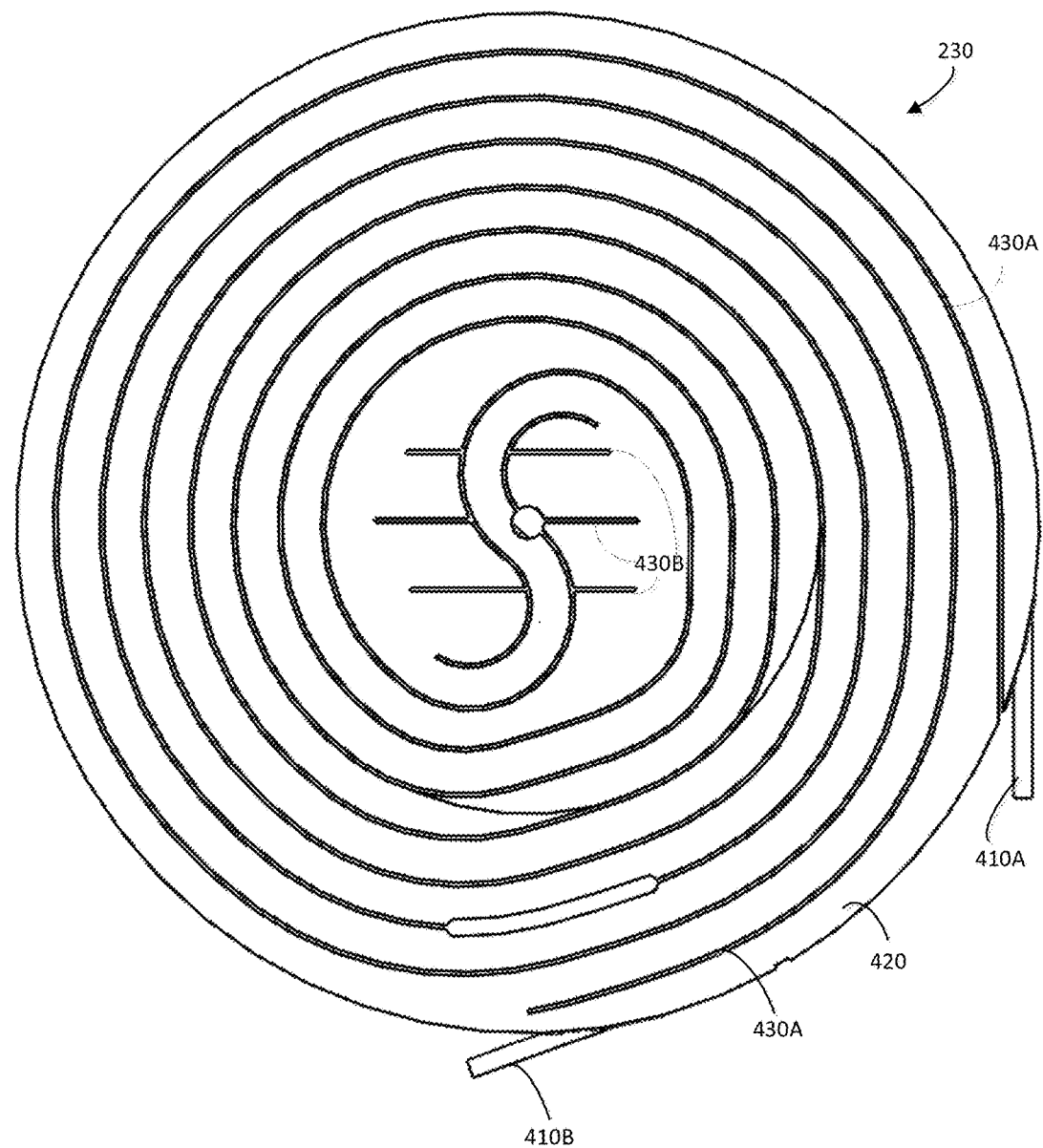
FIG. 4 illustrates a thermal management component comprising a plurality of cuts arranged to reduce eddy currents, in accordance with some embodiments.

Fabrication of a thermal management component 230 in accordance with some embodiments is now described. FIG. 4 illustrates a substrate 420 on which a plurality of cuts are made to reduce the ability of eddy currents to form in the substrate. As discussed above, when an electrically-conductive material such as aluminum is used for substrate 420, eddy currents form in the substrate when it is placed in a time-varying magnetic field. The inventors have recognized that since eddy currents flow in closed loops in a conductor, limiting the amount of contiguous substrate material in which such eddy currents may form, substantially reduces the effect of eddy currents in the thermal management component 230, and thereby provides a thermal management component suitable for use with a low-field MRI system. To this end, one or more cuts may be formed in the substrate 420 to limit the amount of contiguous substrate material. The cuts may include circular cuts 430A, non-circular cuts 430B, and/or any other suitable shape of cuts that reduces the formation of eddy currents (e.g., by reducing the size of the conducting loops) in the substrate when placed in a time-varying magnetic field.

In the embodiment illustrated in FIG. 4, cuts 430A are formed through substrate 420 to form respective spirals. Cuts 430A substantially reduce the size of the regions in which eddy currents can be induced. The geometry of the spiral cuts 430A in FIG. 4, alone, leave larger areas of electrically-conductive material towards the center of the substrate that may allow for the formation of undesirable eddy currents in the substrate. To mitigate this effect, additional cuts 430B are formed to break-up such contiguous regions of substrate into smaller regions, providing less favorable conditions for the formation of eddy currents.

Figure 5:
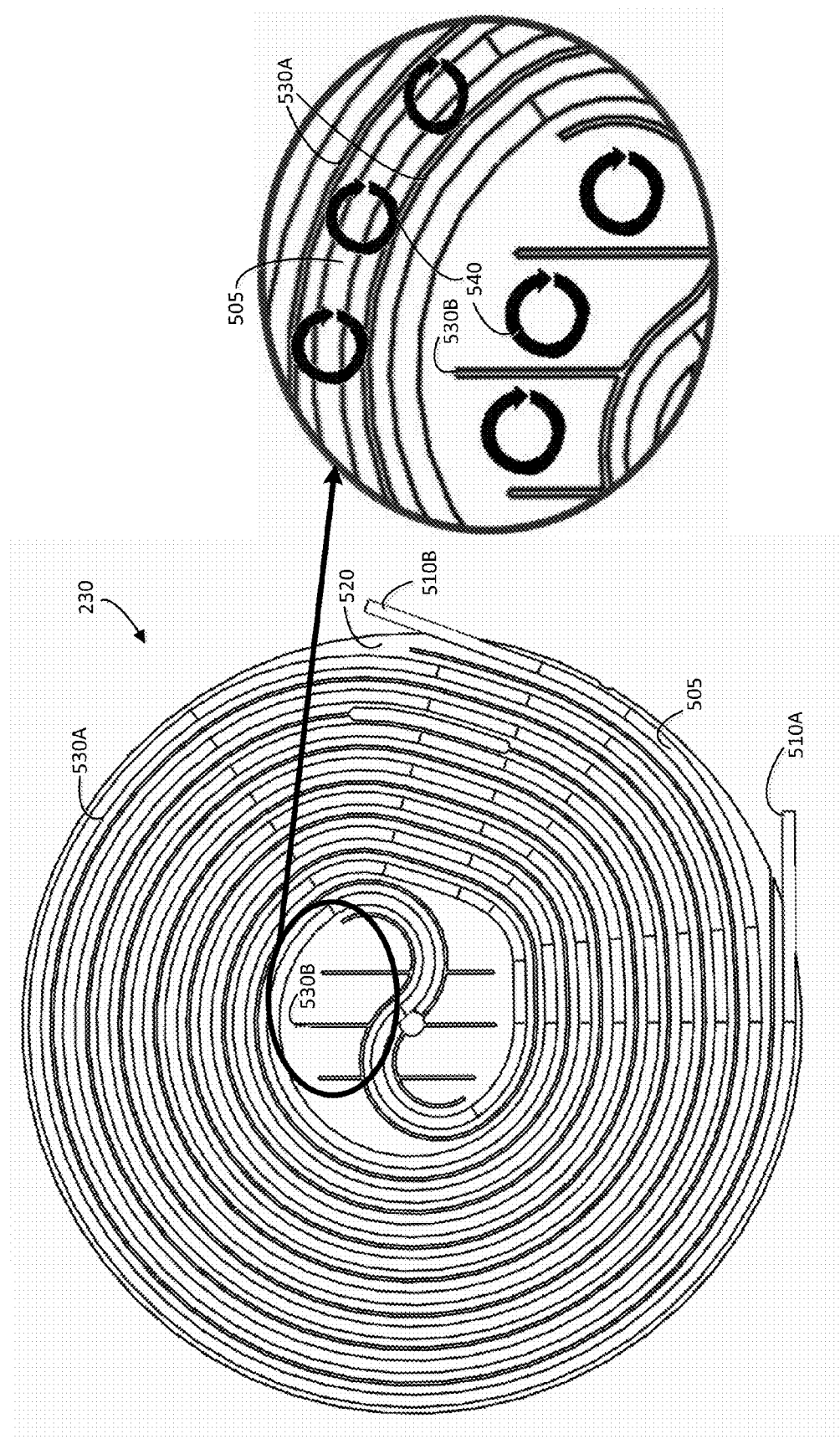
FIG. 5 illustrates an alternate view of the thermal management component of FIG. 4.

FIG. 5 shows an alternate view of thermal management component 230, in which a conduit 505 to circulate a coolant is affixed to substrate 520. Conduit 505 may be affixed to substrate 520 using any suitable technique including, but not limited to, using a thermally-conductive paste. In some embodiments, a groove or trough for the conduit 505 may be formed in the substrate, and thermally-conductive paste may be added to the trough to affix the conduit 505 to the substrate 520. The thermally-conductive paste may also reduce or eliminate air gaps between the conduit (e.g., a copper tube) and the substrate (e.g., an aluminum plate), thereby further improving thermal conductivity.

As shown, conduit 505 is affixed to portions of the substrate between circular cuts 530 in the substrate that have been introduced into the substrate to reduce or eliminate the formation of eddy currents in the substrate, as discussed above. Conduit 505 forms two curves in the interior portion of the spiral to enable the entire conduit 505 to be formed in the same plane. Such a design enables two-sided heat removal and facilitates integration with other magnetics components of the integrated magnetics system 200.

FIG. 5 also shows an enlarged portion of thermal management component 230 to schematically illustrate how cuts in the substrate limit the formation of consequential eddy currents (e.g., by reducing the size of the conducting loops) when the thermal management component 230 is placed in a changing magnetic field. As shown in the enlarged portion, conduit 505 is formed between two circular cuts 530A. Because the substrate material is only contiguous between circular cuts 530A, eddy currents 540 may only arise between the cuts 530A as shown. Similarly, cuts 530B formed in the inner portion of thermal management component 230 restrict the formation of eddy currents 540 to those areas between the cuts 530B. By limiting the amount of contiguous substrate available for eddy currents to form therein, the effect of eddy currents arising in thermal management component 230 may be reduced to acceptable levels to enable the thermal management component to be used for cooling of components of low-field MRI systems, as described herein.

Figure 6:
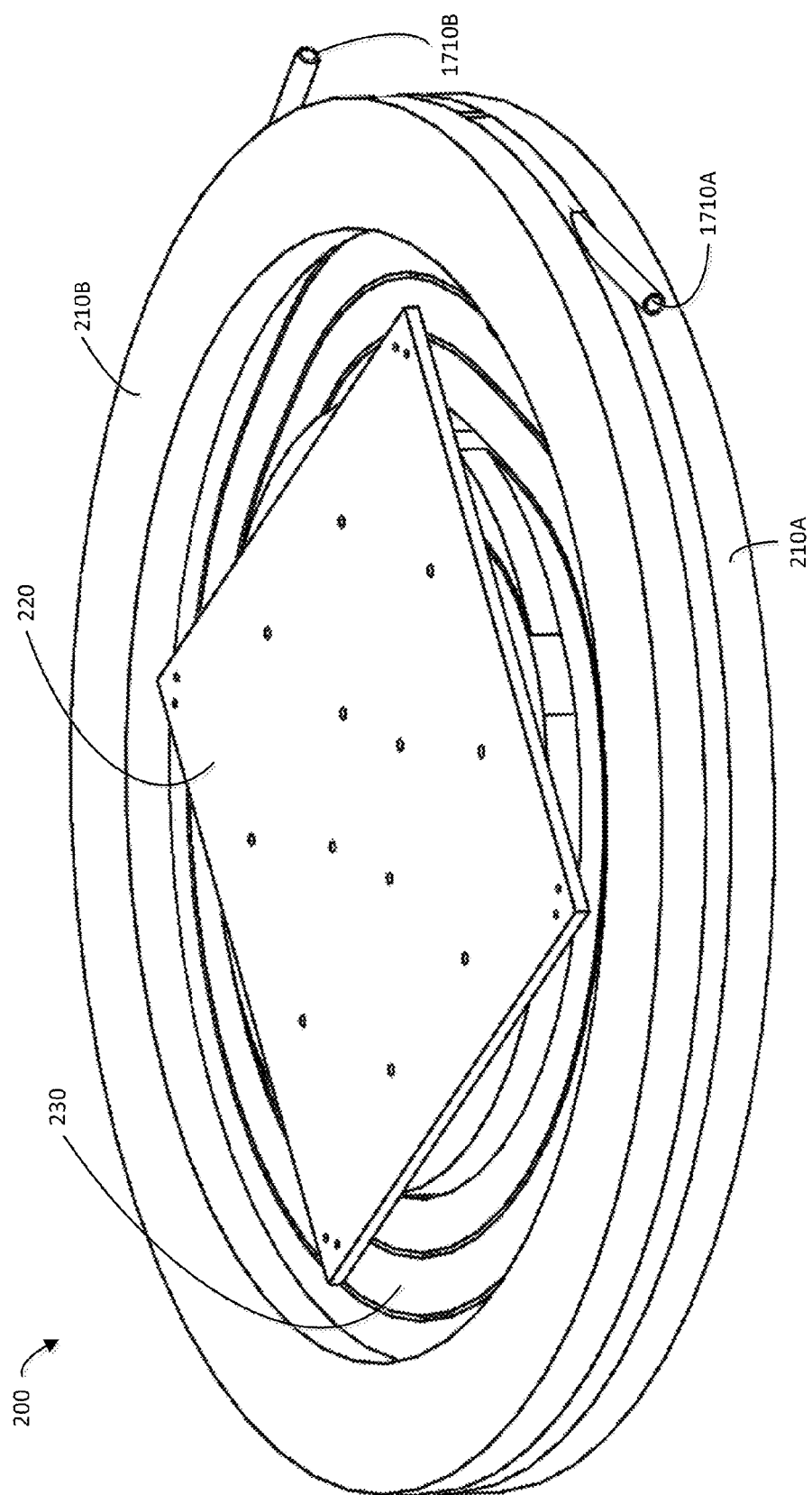
FIG. 6 illustrates an integrated system comprising a thermal management component in accordance with some embodiments.

FIG. 6 shows an alternate view of system component 200 in which thermal management component 230 is arranged between $B_0$ coils 210A and 210B. The close integration of the thermal management component 230 with various magnetics components of the system component 200 provides for efficient thermal cooling of the magnetics components and provides a compact design suitable for use with one or more of the cartable or otherwise portable low-field MRI systems, described herein.

Figure 7A:
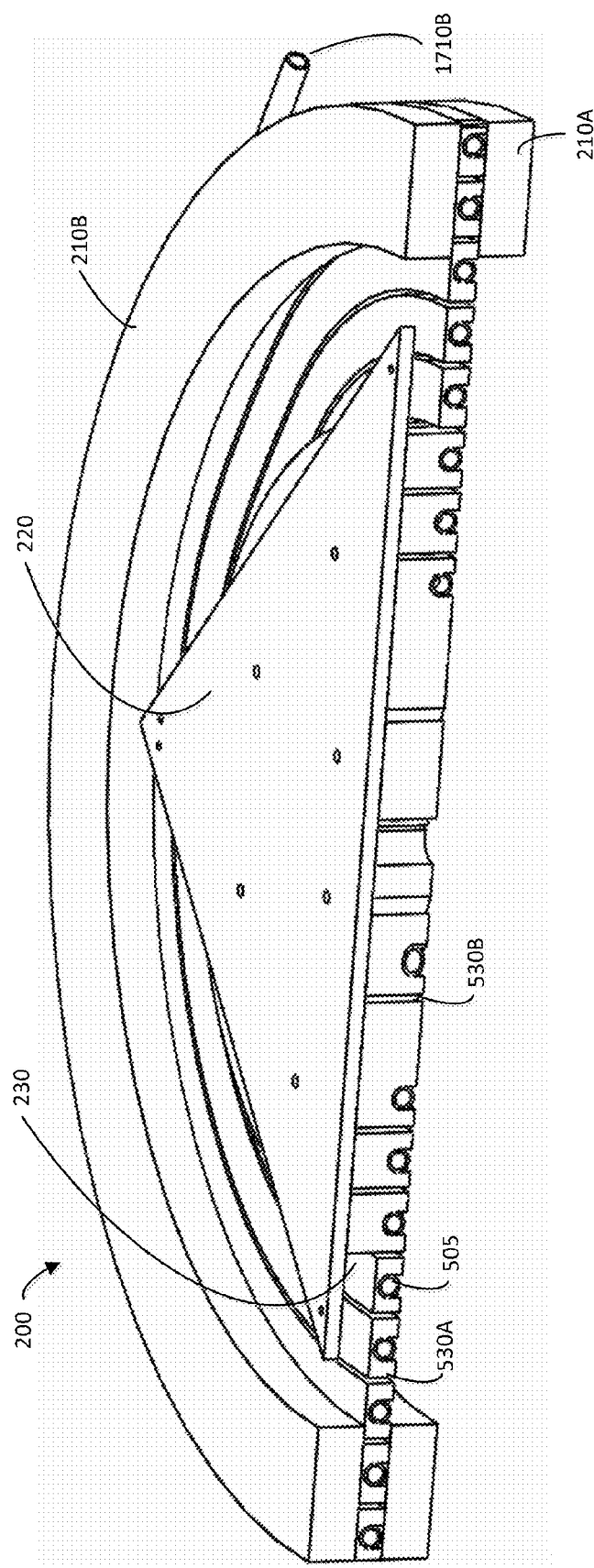
FIG. 7A illustrates a cross-sectional view through the integrated system of FIG. 6.

FIG. 7A shows a cross-sectional view through the system component 200 of FIG. 6. Evident from the cross-sectional view of FIG. 7A is conduit 505 affixed to the substrate of thermal management component 230, spiral cuts 530A arranged to reduce eddy currents in the outer portions of thermal management component 230, and inner cuts 530B arranged to reduce eddy currents in the inner portions of thermal management component 230 when the system component 200 is in operation.

Figure 7B:
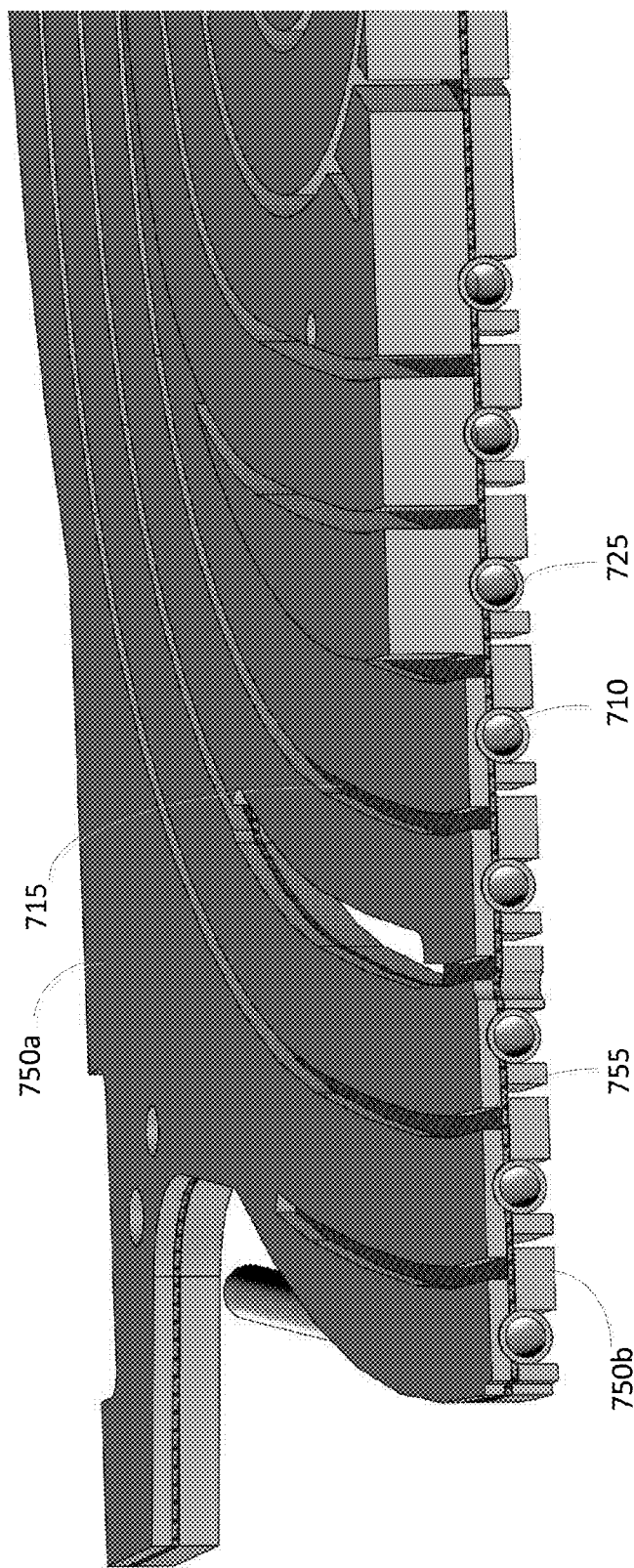
FIG. 7B illustrates a cross-sectional view of a three-ply thermal management component, in accordance with some embodiments.

FIG. 7B illustrates a cross-section view of a three-ply construction for a thermal management component, in accordance with some embodiments. The three-ply construction comprises a thermally conductive top layer 750a (e.g., an aluminum top plate) and a thermally conductive bottom layer 750b (e.g., an aluminum bottom plate). Provided between layers 750a (top ply) and 750b (bottom ply) is a thermally conductive epoxy layer 755 to adhese layers 750a and 750b and provide a measure of rigidity. For example, thermally conductive layer 755 (center ply) may be a glass-filled polycarbonate, or other suitable material. Preferably, the center ply material is chosen to have a similar coefficient of thermal expansion as the top and bottom plies. In this respect, polycarbonate (with or without glass reinforcement) may be a suitable choice when the top and bottom ply material is aluminum. In particular, aluminum has a linear temperature expansion coefficient of 12.30 ($10^{-6}$ m/(in ° F.)) and polycarbonate has a linear temperature expansion coefficient of 12.00 ($10^{-6}$ m/(in ° F.)). An electrically non-conductive material (e.g., an appropriate dielectric material) may be applied to fill in the grooves 715 of the spiral cuts of the top layer 750a to provide additional rigidity and stability to the thermal management component. FIG. 7B also shows conduit 710 (e.g., copper tubing) surrounded by thermally conductive material 725.

As discussed above, some embodiments comprise a thermal management component having a substrate material such as aluminum, which provides good thermal conductivity, but which also demonstrates strong electrical conductivity. For example, the thermal conductivity of aluminum is about 200 W/mK. To reduce the effect of eddy currents arising in the electrically-conductive substrate, some embodiments introduce cuts in the substrate material to reduce the amount of contiguous material in which the eddy currents may form. In other embodiments, a substrate material may be selected, which has good thermal conductivity, but which has poor electrical conductivity. By selecting a material with poor electrical conductivity, the effect of eddy currents is necessarily reduced, as eddy currents require a conductive path to form in the material.

Figure 8:
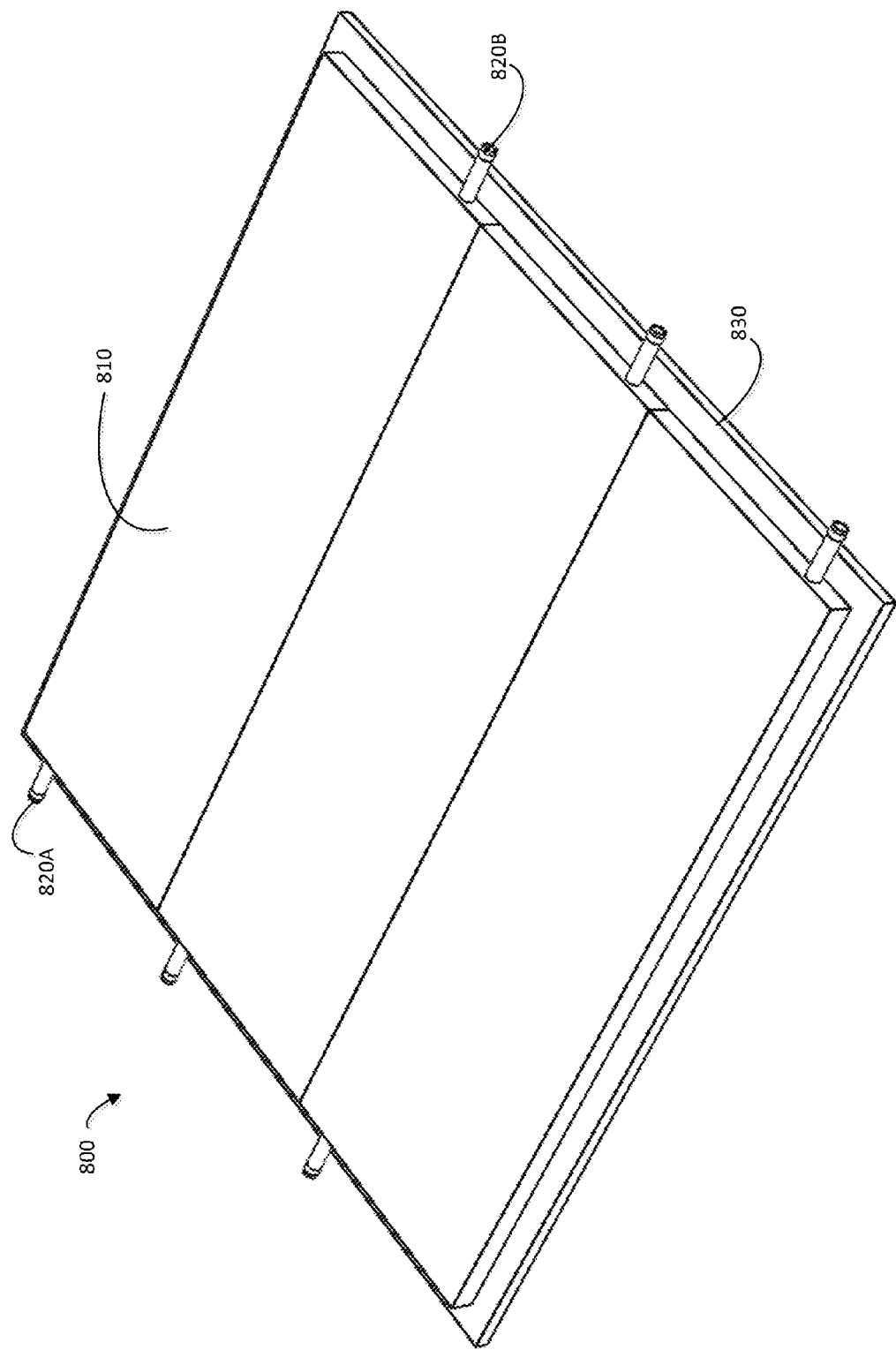
FIG. 8 illustrates a thermal management component for use with a low-field MRI system, in accordance with some embodiments.

FIG. 8 illustrates a thermal management component 800 that may be used in some embodiments to provide thermal cooling to one or more components of a low-field MRI system. Thermal management component 800 comprises one or more conduits having outlets 820A, 820B that may be connected to a source of coolant. The conduits are affixed to one or more layers of a substrate material having good thermal conductivity and poor electrical conductivity. A non-limiting example of such a material is CoolPoly®, available from Cool Polymers, Inc., North Kingstown, R.I. CoolPoly® has a thermal conductivity of about 5-10 W/mK. As shown, thermal management component 800 includes a first layer 810 and a second layer 830 of substrate material, although it should be appreciated that any suitable number of layers (including a single layer) may also be used. Unlike some embodiments described above, in which cuts are introduced to limit the formation of eddy currents in an electrically-conductive substrate, using a substrate material with poor electrical conductivity eliminates the need to introduce cuts in the substrate material, thereby simplifying the fabrication process.

Figure 9:
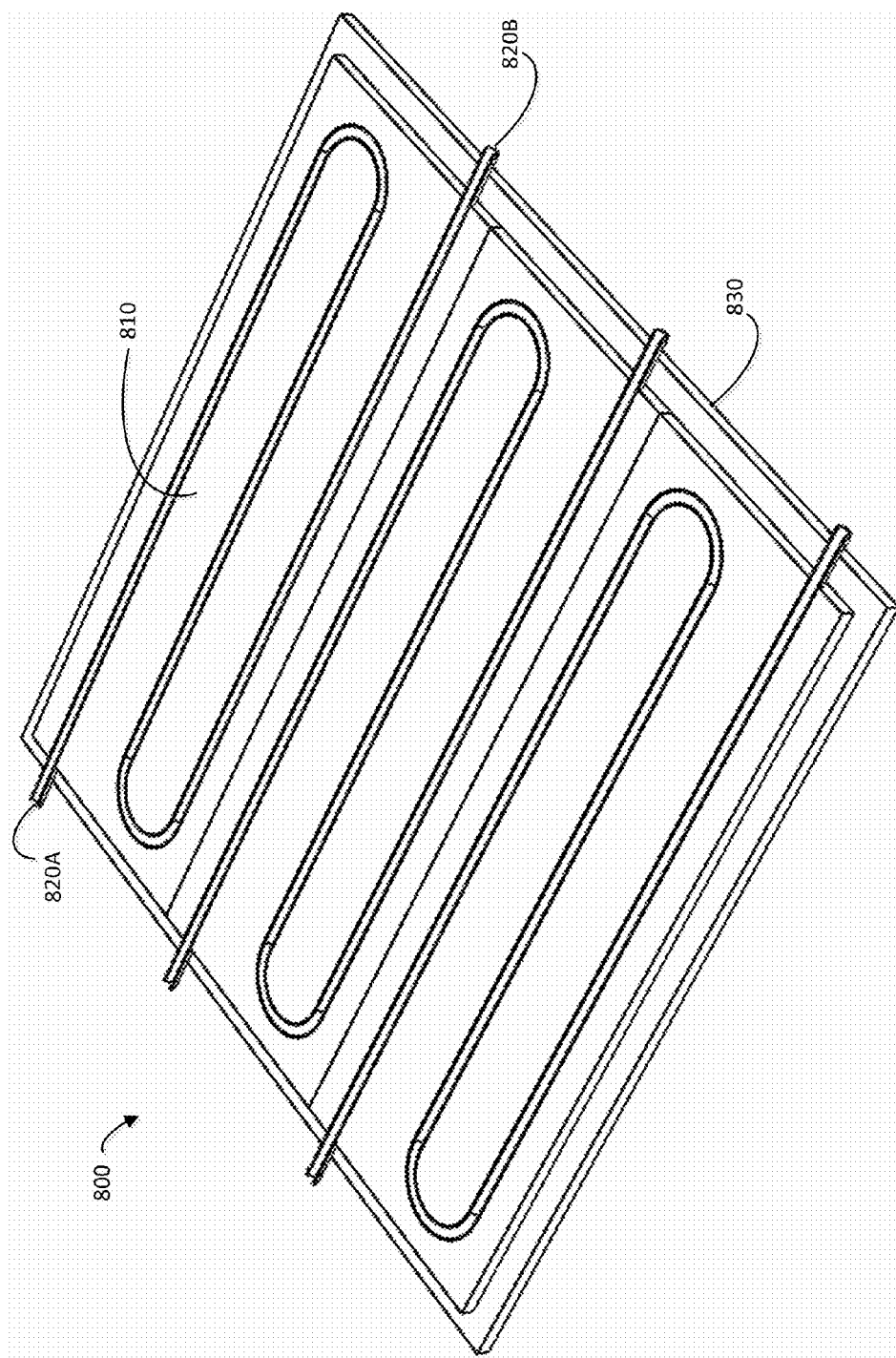
FIG. 9 illustrates a cross-sectional view of the thermal management component of FIG. 8.

FIG. 9 shows a cross-sectional view of thermal management component 800. As shown, thermal management component 800 has a modular design that enables the component to be scaled to any size needed for a particular application. For example, the thermal management component of FIG. 9 includes three panels, each of which includes a conduit having outlets 820A and 820B. By changing the number of panels, the size of the thermal management component may be increased or decreased, as desired. In some embodiments, thermal management component 800 may include only a single conduit. The path of the conduit within the thermal management component 800 may take any suitable shape, and the path shown in FIG. 9 is provided merely as an example and is not limiting. According to some embodiments, multiple parallel pipes are utilized to optimize the pressure drop in the thermal management system. Such a parallel arrangement may be implemented, for example, by use of a manifold.

Figure 10:
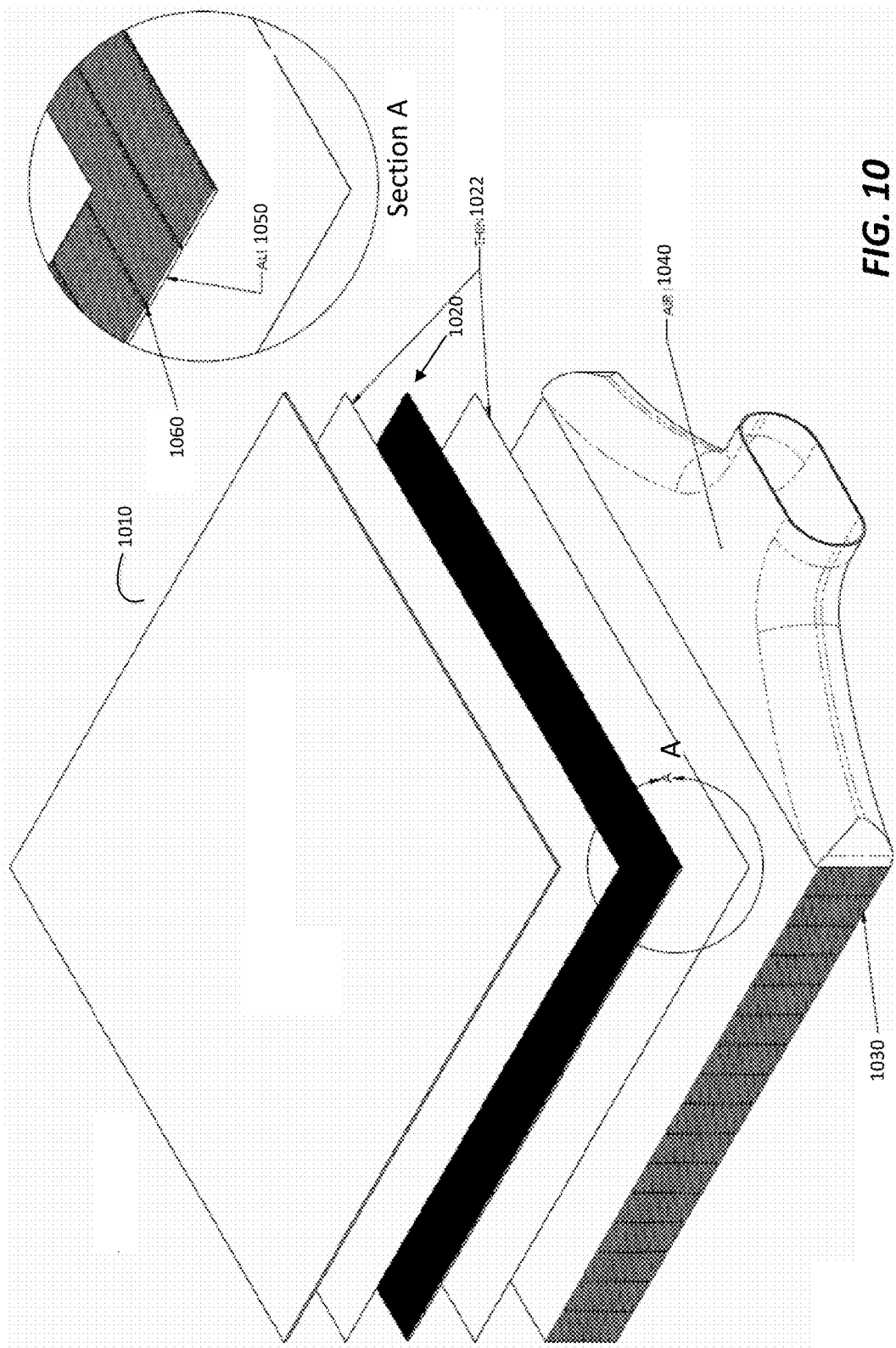
FIG. 10 illustrates an integrated thermal management component in accordance with some embodiments.

Some embodiments include a thermal management component configured to provide cooling of components of a low-field MRI system using gas-based cooling techniques (e.g., air). FIGS. 10 and 11, discussed in more detail below, illustrate non-limiting examples of gas-based thermal management components that may be integrated with magnetics components of a low-field MRI system, in accordance with some embodiments.

FIG. 10 shows a thermal management component that may be integrated with one or more magnetics components of a low-field MRI system, in accordance with some embodiments. For example, the thermal management component may be integrated within a laminate panel (e.g., laminate panel 1030) having one or more magnetic components fabricated thereon. In particular, the exemplary thermal management component illustrated comprises a number of thermal management layers (e.g., cooling layers 1020 and corresponding insulating layers 1022) interleaved between one or more laminate layers 1010 having fabricated thereon one or more magnetics components (e.g., $B_0$ coils, gradient coils, etc.) or portions thereof. As a result, the thermal management component may be integrated within a laminate panel having one or more magnetic components fabricated thereon to draw heat away from heat producing laminate layers (e.g., exemplary laminate layer 1010) to produce cooling of the magnetic components without substantially increasing eddy currents that may be problematic for low-field MR imaging.

As shown in FIG. 10, the integrated thermal management component includes thermal management layers, one of which is illustrated by cooling layer 1020 interposed between insulating layers 1022. In some embodiments, cooling layer 1020 includes a plurality of thermally-conductive fin strips arranged in a heat exchanger configuration, as discussed in more detail below. Cooling layers 1020 may be adapted in numerous ways that may depend on the type of fluid (e.g., liquid or gas) to be passed through the cooling layer. In air cooled thermal management components, for example, cooling layers 1020 may be any type of plenum layer, some embodiments of which are described in further detail below. Insulating layers 1022 arranged on either side of cooling layer 1020 provide electrical isolation from adjacent laminate layers (e.g., laminate layer 1010) on which one or more magnetic components (or portions thereof) are fabricated.

As discussed, a laminate panel may include numerous laminate layers 1010 on which one or any combination of magnetic components may be fabricated (e.g., one or more B0 coils, one or more gradient coils, one or more transmit/receive coils, one or more shim coils, etc., or portions thereof). Any number of thermal management layers (e.g., cooling layers 1020 and corresponding insulation layers 1022) may be interleaved as desired between any number of laminate layers 1010 having heat producing components (e.g., magnetic components) fabricated thereon to form a laminate panel 1030 having an integrated thermal management component. In this manner, thermal management layers can be provided and distributed as needed to cool the various laminate layers of a laminate panel. Additionally, a single thermal management layer may be interleaved between successive laminate layers or multiple thermal management layers may be stacked between successive laminate layers, as the aspects are not limited in this respect. The operation of the thermal management layers (e.g., cooling layers 1020 and corresponding insulation layers 1022) are described in further detail below.

In some embodiments, insulating layers 1022 may comprise pre-impregnated composite fibers (pre-preg) or any other suitable dielectric insulating material such as polyimide film (e.g., Kapton® available from DuPont, Wilmington, Del.). Insulating layers 1022 may have any suitable thickness sufficient to provide electrical isolation as needed. In some embodiments wherein the cooling layers do not include electrically conductive material, the insulating layers may not be necessary and can be eliminated.

In some embodiments, one or more adhesive layers (not shown) may be bonded to insulating layers 1022 to facilitate adhesion of the layers in laminate panel 1030. Alternatively, insulating layers 1022 may comprise material(s) with adhesive properties that facilitate adhesion of the layers. In yet other embodiments, adhesion of the layers in laminate panel 1030 may be accomplished using other bonding techniques including, but not limited to, using a curing process and fixing the layers using a mechanical technique such as bolting.

In FIG. 10, the inset labeled Section A in FIG. 10 shows an enlarged view of cooling layer 1020 that may be used in accordance with some embodiments. As shown, cooling layer 1020 includes a plurality of corrugated fin strips 1050 separated by gaps 1060. In some embodiments, fin strips 1050 may be aluminum fin stock fabricated into a corrugated heat exchanger configuration as shown to increase the surface area of the aluminum conductor thereby improving its effectiveness in heat removal when fluid (e.g., air) flows over the conductor. When fluid flows over the corrugated fin strips 1050, a turbulent flow is created, which enhances the heat transfer capabilities of thermal management component compared to a configuration in which a laminar flow of fluid is produced. However, configurations in which laminar flow is created may be used as well.

As discussed above, the inventors have recognized that use of electrically-conductive materials, such as aluminum, for cooling components of a low-field MRI system may result in the creation of undesirable eddy currents in the material, which affects the quality of imaging with the MRI system. Eddy currents may be reduced by limiting the contiguous area of electrically-conductive material in which the eddy currents may form. In some embodiments in which electrically-conductive fin stock is used, the contiguous area of electrically-conductive material may be reduced by introducing gaps 1060 between adjacent strips 1050 of the electrically-conductive fin stock. Gaps 1060 provide conductive discontinuities between adjacent strips 1050, which prevents eddy currents from forming in the adjacent strips. Accordingly any eddy currents induced in the conductive strips are constrained to individual strips.

Controlling the width dimension of the conductive strips enables the amount and/or strength of eddy currents induced in a conductive strip to be reduced to a level acceptable for use in a low-field MRI system. For example, a suitable width of corrugated fin strips 1050 may be approximately two inches for some designs, though wider or narrower strips may alternatively be used. The choice of the dimensions may depend on the design of the system. In some embodiments, wider (e.g., four inch) strips 1050 may provide for simplified fabrication, while still providing an acceptable level of eddy currents for low-field MR imaging. Gaps 1060 may also have any suitable width (e.g., one mm) provided that the gaps provide sufficient electrical isolation between adjacent strips. It should be appreciated that the dimensions of the plenum structures of the cooling layers may depend on the particular design and/or scale of the laminate panels and/or the heat dissipation requirements imposed on the thermal management component.

Thermal management component 1000 also includes input port 1040 through which fluid (e.g., air) is introduced into thermal management component 1000 (e.g., input port 1040 may be connected to a blower or air compressor or other fluid source). The fluid introduced through input port 1040 flows across the cooling layers 1020 and exits an output port (not shown). As the fluid flows across the cooling layers, heat is transferred to the fluid, providing for cooling of the low-field MRI components fabricated within laminate panel 1030. It should be appreciated that input port 1040 can be configured to deliver, and the thermal management layer can be configured to receive, fluid of any type, including both liquids (e.g., water) and gas (e.g., air), as the aspects are not limited in this respect.

FIG. 11 shows an alternative embodiment of a thermal management component that may be used to cool one or more components (e.g., one or more magnetic components fabricated on exemplary laminate layer 1110, or fabricated on other laminate layers in laminate panel 1130) of a low-field MRI system. The design of the thermal management component illustrated in FIG. 11 provides an alternate cooling "layer" that may simplify the fabrication process for an integrated thermal management component. For example, the cooling mechanism may be composed of a plurality of electrically non-conductive spacers 1120, which separate adjacent layers of laminate panel 1130 enabling a fluid (e.g., air) to flow across the layers of the laminate panel. By using non-conductive spacers, eddy currents are not induced in the material used to construct the thermal management component. Additionally, further insulating layers are not required, reducing the number of layers that need to be formed to implement an integrated thermal management component. While the plurality of non-conductive spacers 1120 are illustrated in FIG. 11 as small buttons that separate the layers of laminate panel 1130, it should be appreciated that any shape and arrangement of spacers may alternatively be used to form a plenum that allows fluid to flow between layers of laminate panel 1130 to transfer heat away from heat producing components fabricated thereon. Non-conductive spacers 1120 may be fabricated in any suitable way. For example, non-conductive spacers may be robotically placed and bonded to the one or more desired layers for which cooling is desired.

The above-described thermal management components use liquid coolant (e.g., water) or gas coolant (e.g., air) as the medium for transferring heat away from one or more components of a low-field MRI system. In yet other embodiments, a combination of liquid coolant and gas coolant may be used. Specifically, any one or combination of fluids (liquid or gas) may be used to transfer heat in a thermal management component using techniques described herein. A particular thermal management component configuration may be selected based, at least in part, on the power output of the low-field MRI system and/or the thermal conductivity of the thermally-conductive material used in the thermal management component. For example, a liquid-based thermal management component may be used in some embodiments that have higher power outputs (e.g., in the several kilowatt range) than embodiments that have lower power outputs (e.g., in the 1-2 kilowatt range), though aspects are not limited in this respect.

Figure 12A:
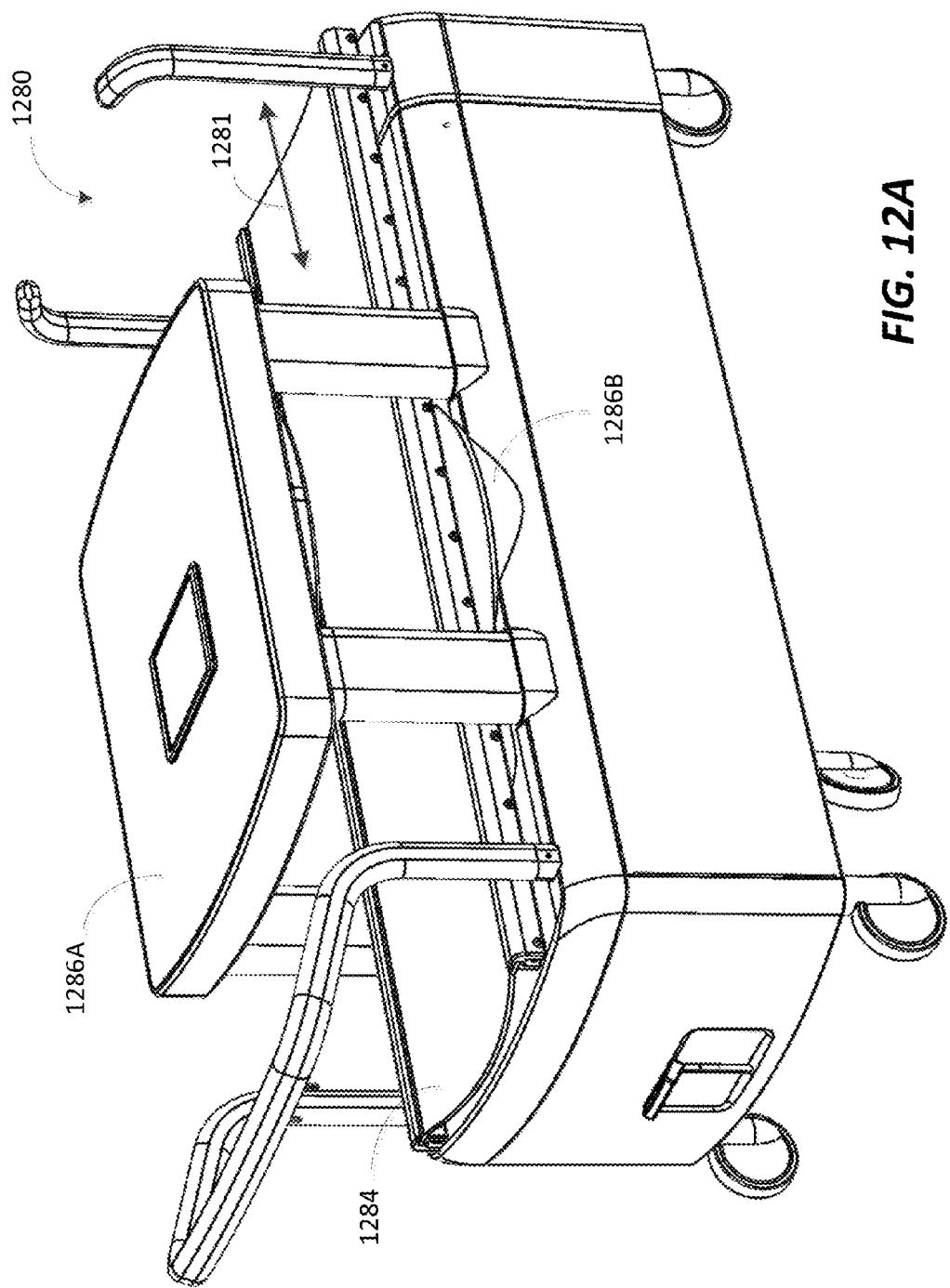
FIG. 12A illustrates an example of a convertible low-field MRI system, in a collapsed configuration, that uses thermal management techniques described herein, in accordance with some embodiments.
Figure 12B:
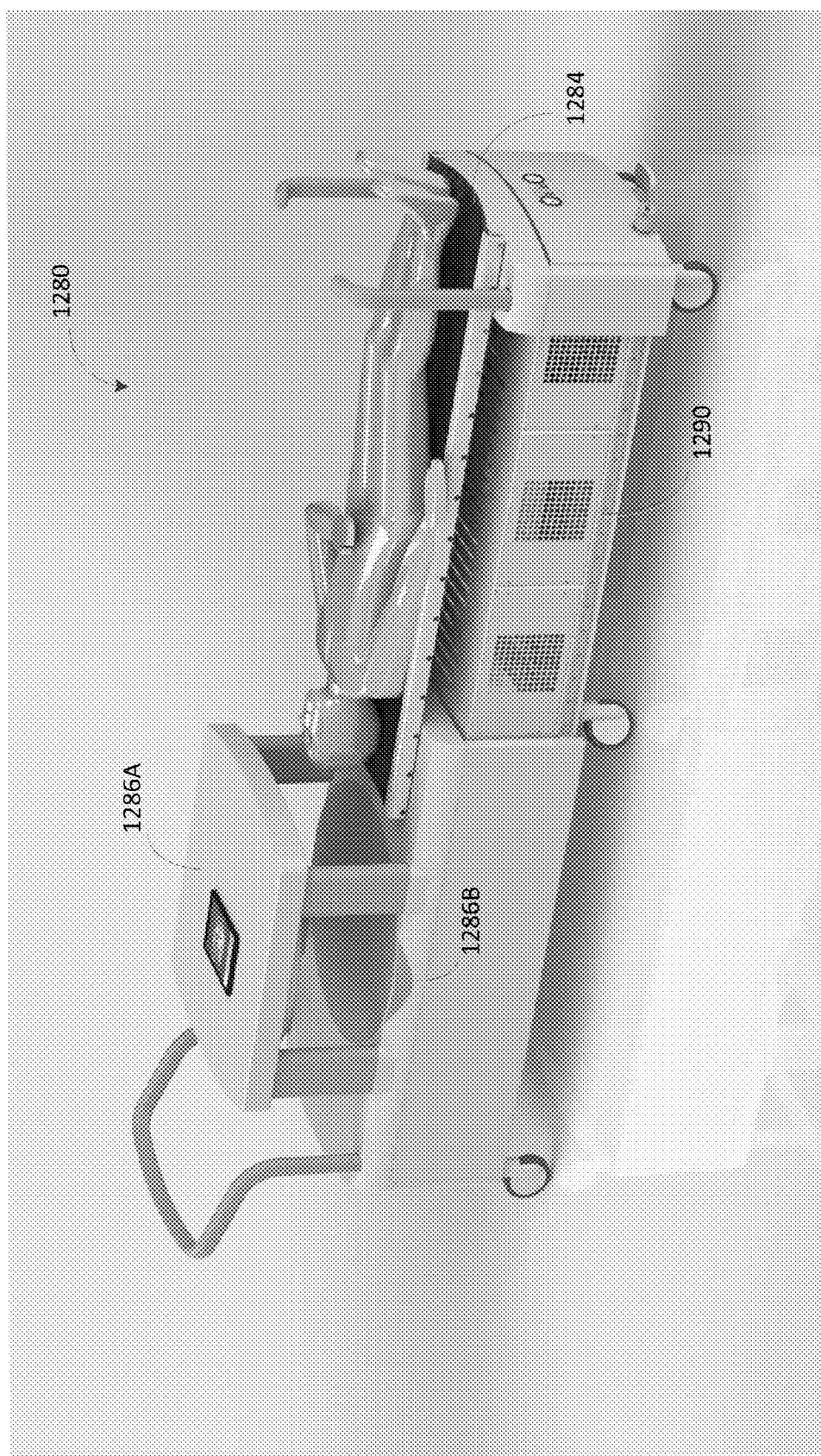
FIG. 12B illustrates an example of the convertible low-field MRI system, in an extended configuration, that uses thermal management techniques described herein, in accordance with some embodiments.

FIG. 12A illustrates an example of a convertible low-field MRI system 1280 using thermal management techniques described herein, in accordance with some embodiments. In FIG. 12A, the convertible system is in a collapsed configuration convenient for transporting the system or storing the system when it is not in use. Convertible system 1280 includes a slide-able bed 1284 configured to support a human patient and to allow the patient to be slid into and out from the imaging region between housings 1286A and 1286B in the direction of arrows 1281. Housing 1286A and 1286B house magnetic components for the convertible system 1200, as discussed in further detail below in connection the several views of the convertible system 1280. The magnetic components may be produced, manufactured and arranged using any suitable technique or combination of techniques. FIG. 12B illustrates convertible system 1280 extended and with a patient positioned on slide-able bed 1284 prior to being inserted between housings 1286A and 1286B to be imaged. Housings 1286A and 1286B and extendable portion 1290 also house components of a thermal management system, as discussed in further detail below.

Figure 12C:
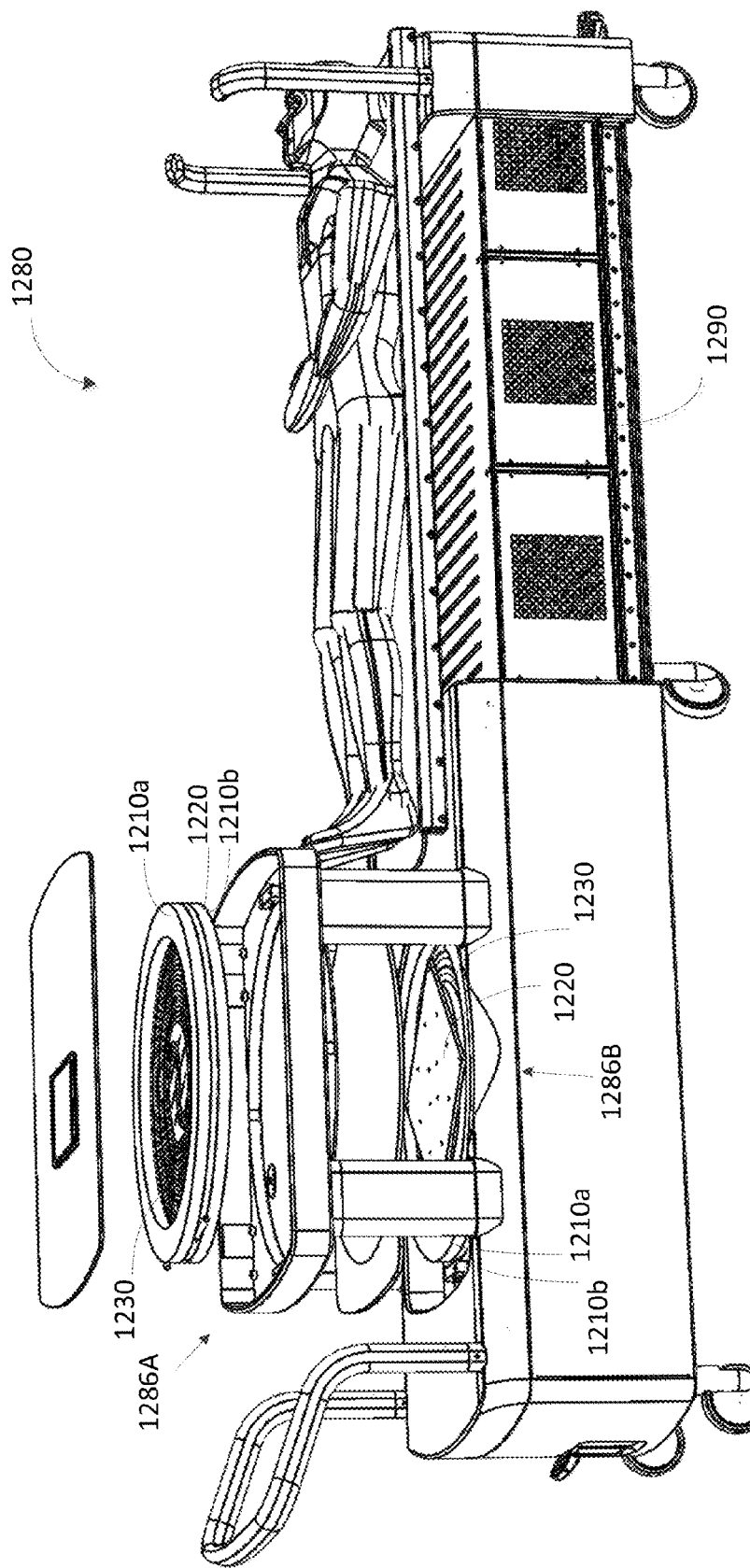
FIG. 12C illustrates the convertible low-field MRI system with an exploded view of thermal and magnetic components, in accordance with some embodiments.
Figure 12D:
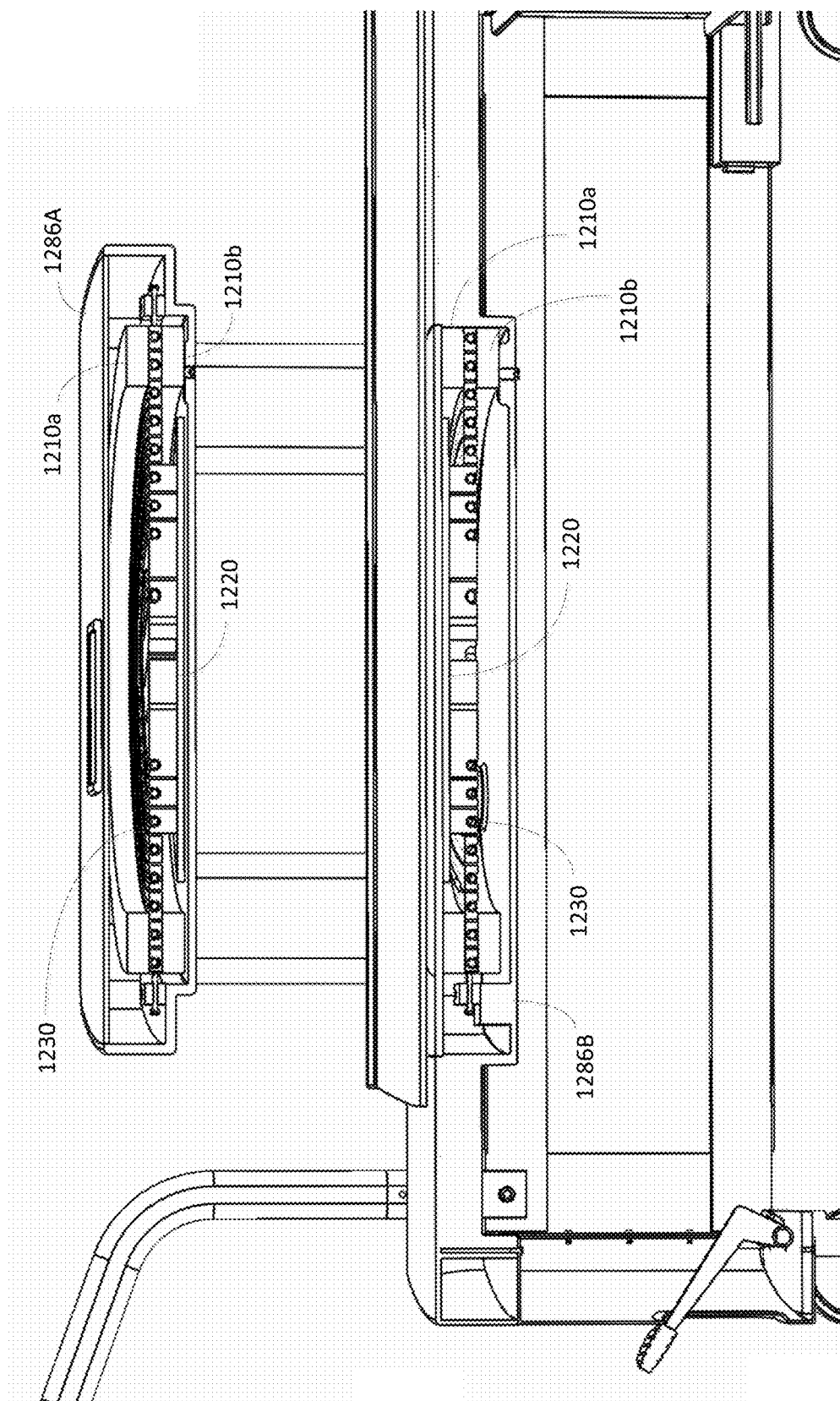
FIG. 12D illustrates a cross-sectional view of thermal and magnetic components of the convertible low-field MRI system, in accordance with some embodiments.

FIG. 12C illustrates an exploded view of housings 1286A and 1286B. As shown, each of housings 1286A and 1286B houses magnetic components coupled to a thermal management component to draw heat away from the magnetic components. Specifically, each of housings 1286A and 1286B included therein B0 coils 1210a and 1210b, laminate panel 1220 (which is visible within housing 1286B in the face-up arrangement) and thermal component 1230 provided between the B0 coils. This arrangement may be similar to that illustrated in FIG. 2 by system component 200, wherein both of housings 1286A and 1286B house such a component, or may correspond to any other arrangement described herein, as the aspects are not limited in this respect. In particular, thermal component 1230 may be arranged between or proximate to any arrangement of magnetic components produced using any combination of laminate panel techniques and/or produced conventionally. FIG. 12D illustrates a cross-sectional view of housings 1286A and 1286B with magnetics and thermal management components housed therein.

Figure 12E:
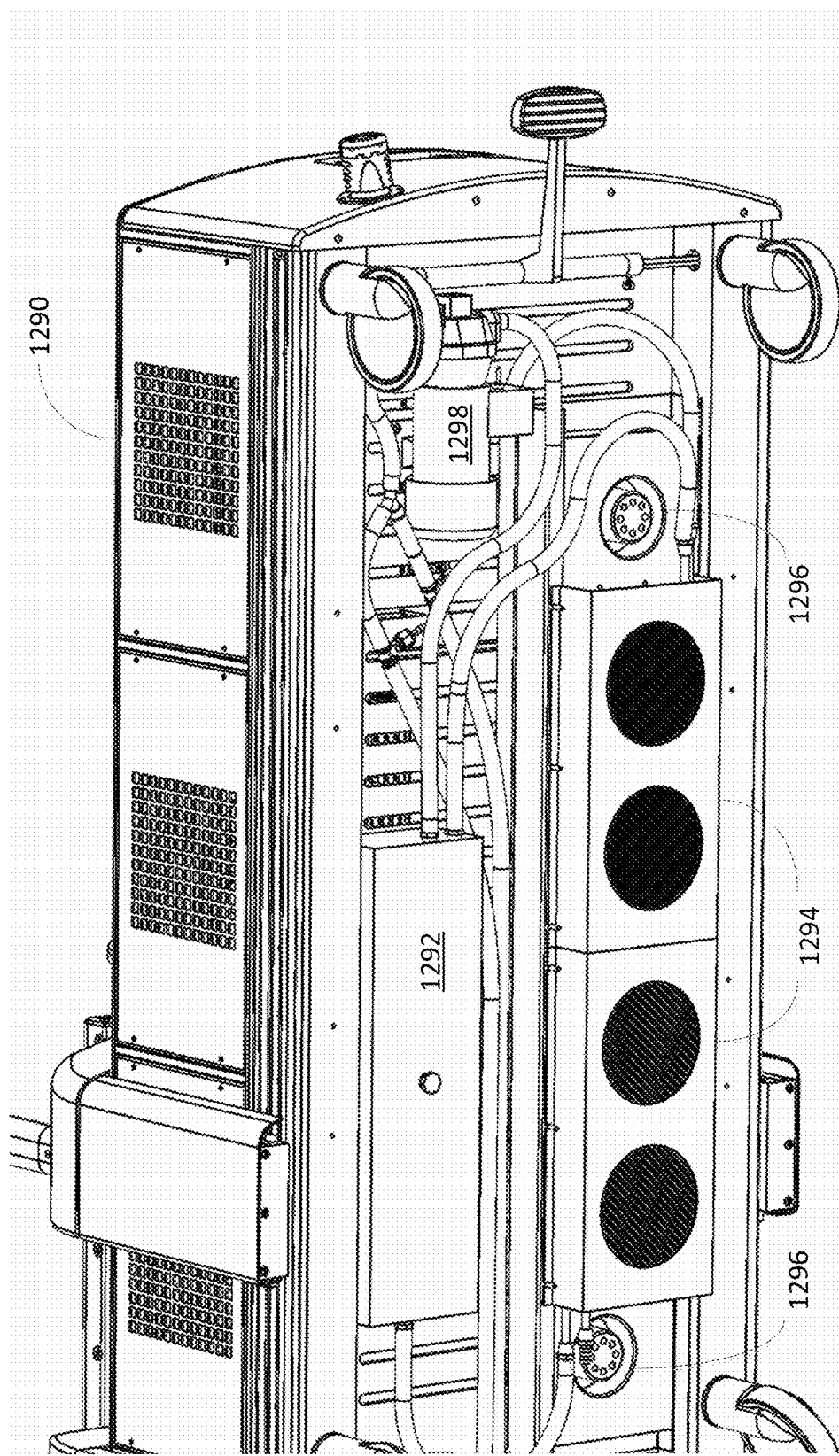
FIG. 12E illustrates a view of the extendable portion of the convertible low-field MRI system showing further components of thermal management system, in accordance with some embodiments.

FIG. 12E illustrates a view of extendable portion 1290 showing several components of a thermal management system, in accordance with some embodiments. For example, the components provided on or within extendable portion 1290 can be connected to thermal management component 1230 to circulate fluid (e.g., a liquid or gas coolant) through the tubing of the thermal management component 1230 to transfer heat away from magnetic components (or other heat producing components) of the low-field MRI system. In the embodiment illustrated in FIG. 12E, the thermal management system includes a reservoir 1292 for storing a cooling fluid and a pump 1298 for pumping the fluid from the reservoir 1292 to thermal management component 1230. The fluid pumped through thermal management component 1230 transfers heat away from heat generating components of the low-field MRI system to heat exchangers 1294. Blowers 1296 may exhaust heated air transferred from the circulating cooling fluid by heat exchangers 1294. The cooling fluid may then return to the reservoir and again be circulated through the system to cool heat generating components of the system.

As discussed above, the cooling fluid may be a liquid, such as water, or a gas such as compressed air. When the cooling fluid is a gas, pump 1298 may include a compressor to compress the gas to facilitate circulation throughout the system. The cooling fluid may be other super-cooled materials, such as liquid nitrogen or any other suitable fluid. According to some embodiments, the cooling fluid may be obtained from an external source, such as a water hook-up, such that one or more of the components illustrated in FIG. 12E may not be necessary, or may be replaced with components configured to connect to the external source at an inlet and deposit fluid at an outlet after the fluid has been circulated, as discussed in connection with some embodiments described in the foregoing.

The inventors have recognized that precise alignment of the magnetics components of a low-field MRI system are important for producing a system capable of providing images of a suitable quality for clinical imaging. However, ensuring such a precise alignment is difficult due, at least in part, to manufacturing tolerances for the various components of the system. According to some embodiments, manufacturing tolerances for individual components of a low-field MRI system may be disregarded by forming the magnet assembly into a single rigid assembly that is post-machined after assembly.

Figure 13:
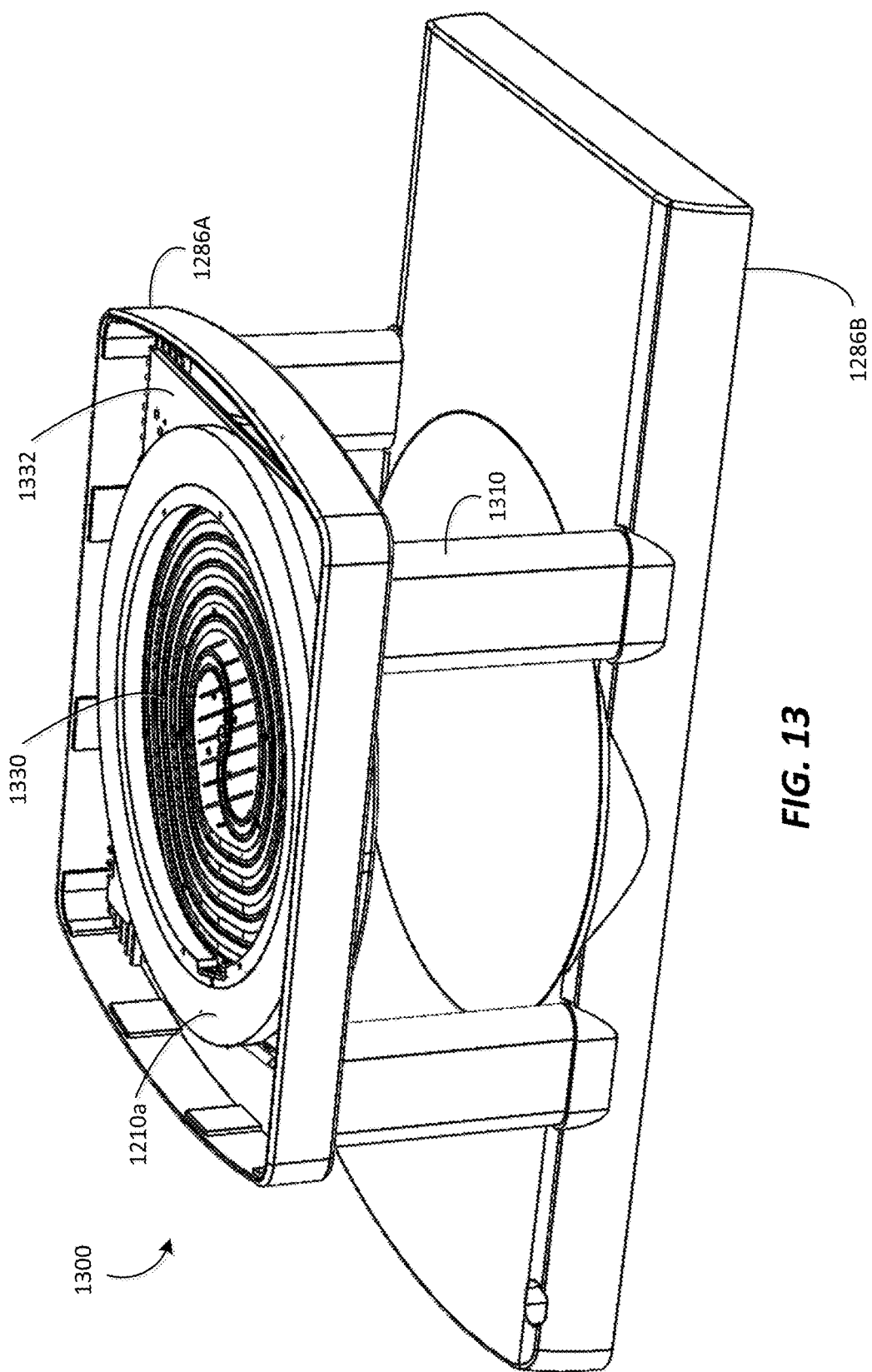
FIG. 13 illustrates a magnetics assembly used to facilitate a precise alignment of components of a low-field MRI system in accordance with some embodiments.

FIG. 13 illustrates components of a magnet assembly 1300 for a low-field MRI system in accordance with some embodiments. The magnet assembly includes an upper housing 1286A and a lower housing 1268B connected using a plurality of posts or pillars 1310 that provide separation between magnetics components housed in the upper and lower housings to provide an imaging region into which a subject may be inserted. Upper housing 1286A includes a multi-layer magnetics component comprising a pair of B0 coils (only upper B0 coil 2010a is shown) separated by a thermal management component 1330, examples of which are described above. As shown, thermal management component 1330 includes both a cooling portion adapted to draw heat away from the magnetic components to which it is coupled, and mounting portions 1332, which extend outwardly from the magnetics components to enable the multi-layer magnetics component to be secured to the upper housing 1286A using bolts or any other suitable type of fastener.

Figure 14:
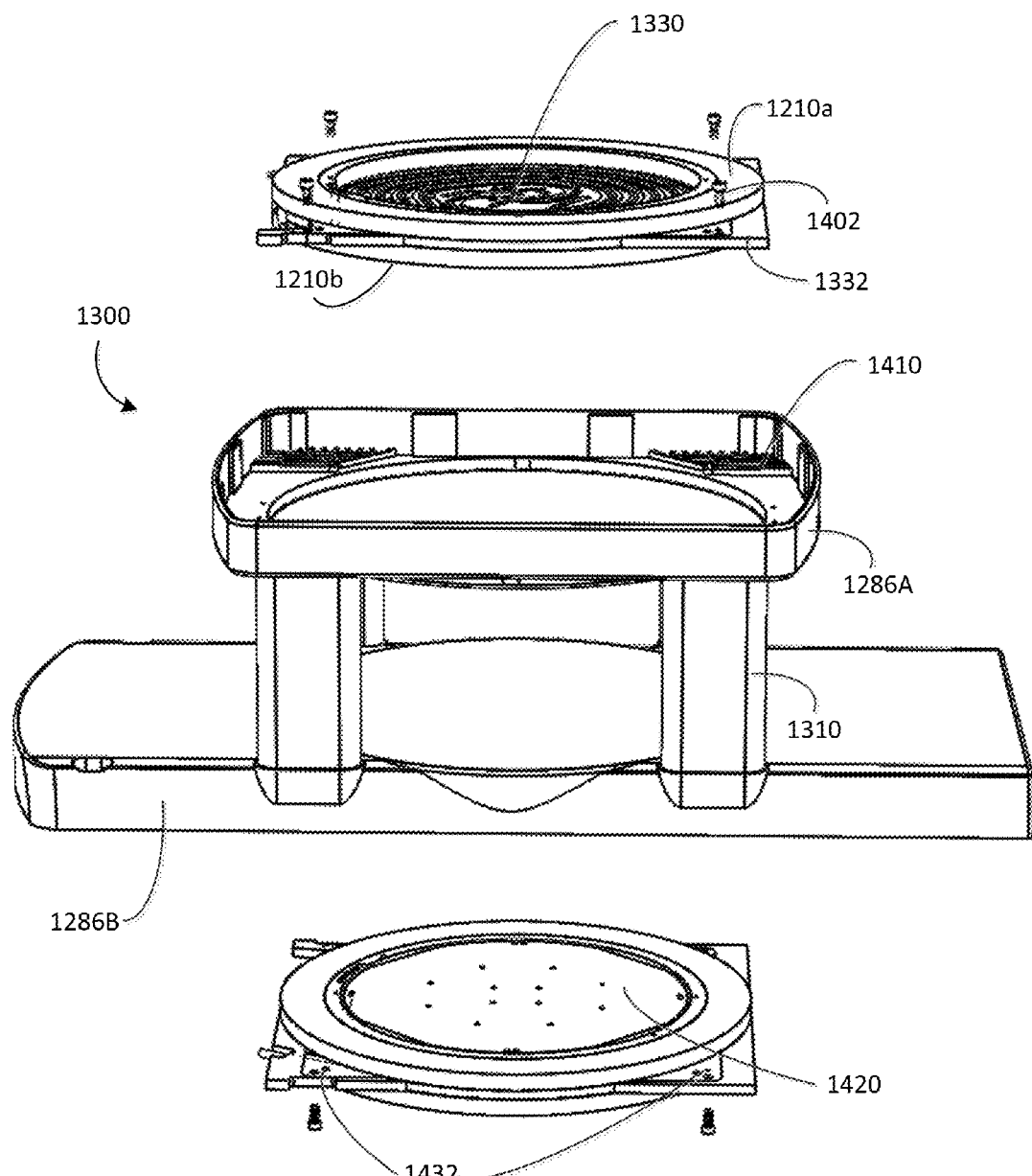
FIG. 14 illustrates an exploded view of the magnetics assembly of FIG. 13.

FIG. 14 illustrates an exploded view of the magnet assembly 1300 shown in FIG. 13. Additional aspects of the multi-layer magnetics component including B0 coils 1210a and 1210b, and mounting portions 1332 of the thermal management component 1330 are shown. Also shown are mounting portions 1410 of upper housing 1286A, which are adapted to be secured to mounting portions 1332 of thermal management component 1330 with bolts 1402 when the magnetic assembly is assembled. FIG. 14 also shows a second multi-layer magnetics assembly 1420, which includes mounting portions 1432 adapted to secure the multi-layer magnetics assembly to lower housing 1286B.

Figure 15A:
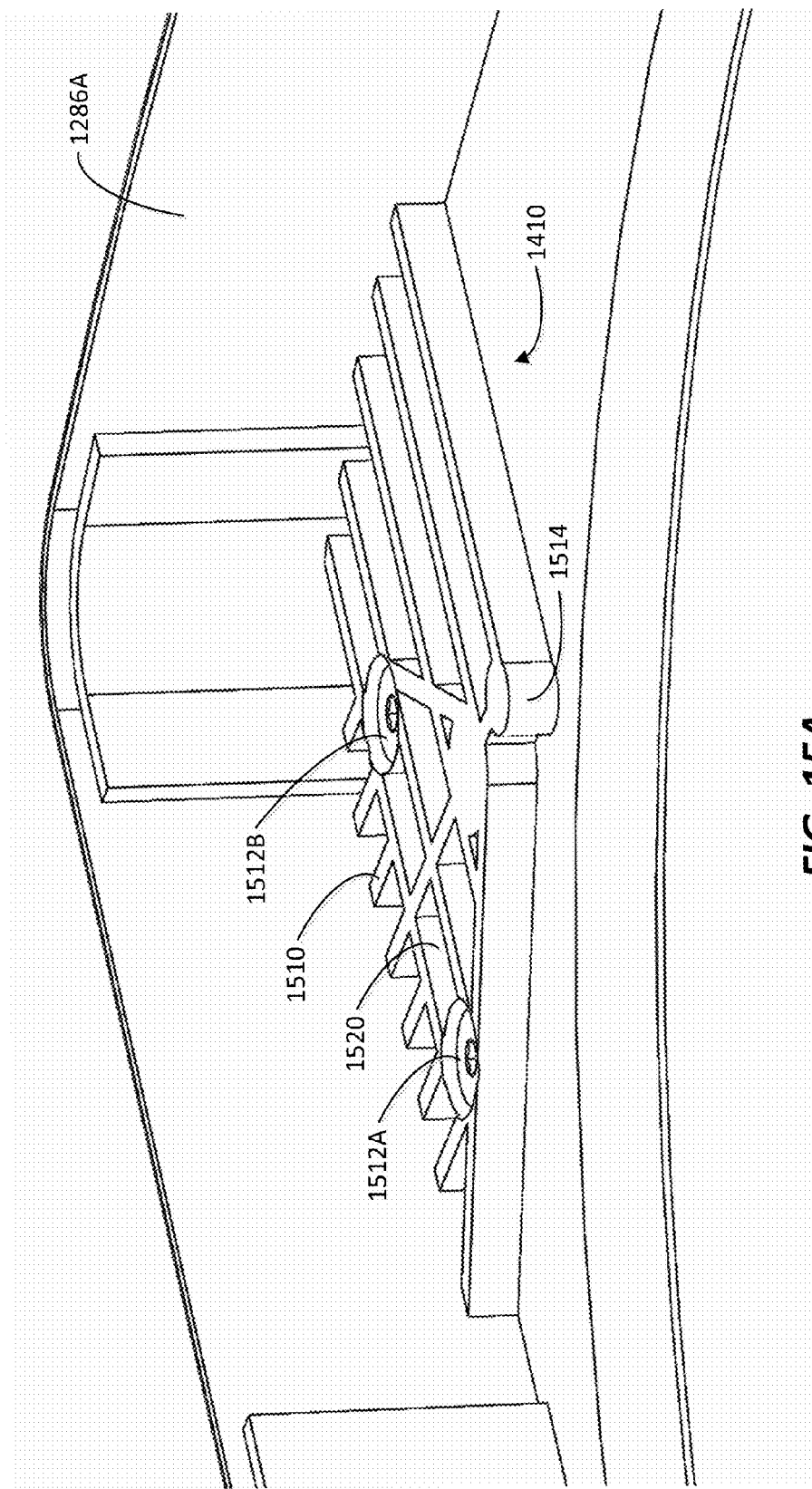
FIG. 15A illustrates a pre-machined mounting portion of an upper housing of the magnetics assembly of FIG. 13.

FIG. 15A illustrates a portion of upper housing 1286A showing a more detailed view of mounting portion 1410 to which the corresponding mounting portion of the thermal management component may be connected. As shown, mounting portion 1410 includes a plurality of structures configured to engage with the mounting portions of the thermal management component. The structures include a plurality of rigid ribs 1510 formed within a corner of upper housing 1286A. Ribs 1510 form the support structure on which the mounting portion of the thermal management component is placed. As shown, ribs 1510 form a rigid grid-like structure with vertical ribs extending from a first side of the upper housing and horizontal ribs extending from a second side of upper housing. It should be appreciated that any suitable number of ribs 510 and spacing between the ribs may be used, and the configuration shown in FIG. 15A is merely one example of a suitable configuration.

As discussed above, the components of the magnet assembly may be fastened using bolts or any other suitable type of fasteners. Accordingly, mounting portion 1410 also includes fastener holes 1512A and 1512B through which the fasteners may be inserted when the magnet assembly is assembled. Although only two fastener holes are shown, it should be appreciated that any suitable number of fasteners and corresponding fastener holes may be used. In accordance with some embodiments, a plurality of dowel pins are used to precisely spatially align the thermal management component and the mounting portion 1410 of the upper housing 1286A. Accordingly, mounting portion 1410 may include dowel pin support structure 1514 into which a hole for a dowel pin may be formed. Various electronic connectors may be used to connect electronics in the upper and lower and magnetics assemblies. Accordingly, one or more of the spaces between ribs 1510 may form wire chases 1520 through which the electrical connectors may be placed. For example, wire chases 1520 may be formed directly above the pillar support structures separating the upper housing and lower housing structures to enable electrical connectors to be formed through one or more of the pillar support structures.

Figure 15B:
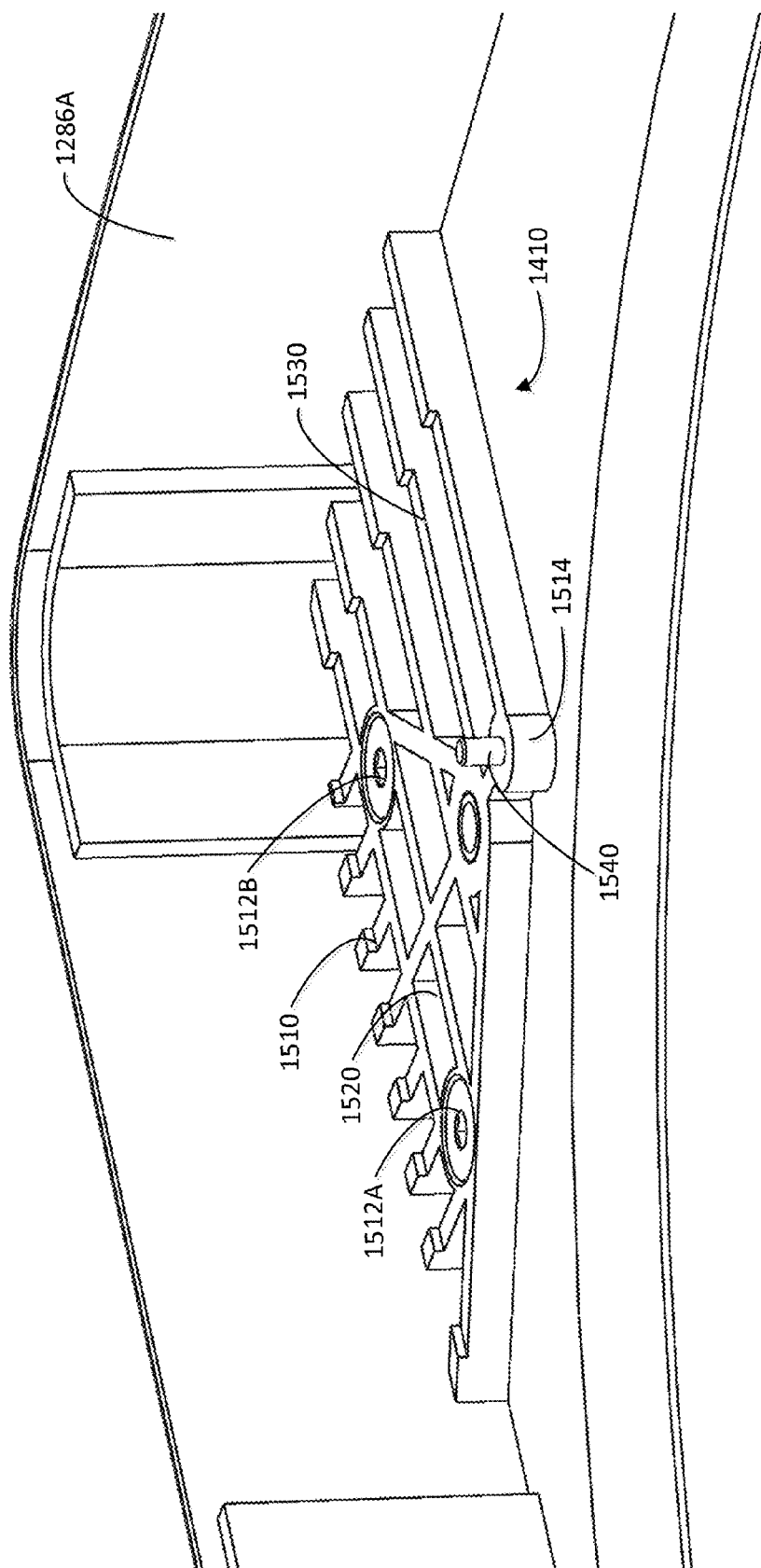
FIG. 15B illustrates a post-machined mounting portion of the upper housing of FIG. 15B.

As discussed above, ensuring a precise alignment of the magnetics components in the magnetic assembly is difficult due, at least in part, to manufacturing tolerances for the various components of the system. In accordance with some embodiments, the component manufacturing tolerances may be ignored by assembling the components and post-machining the assembled structure after assembly. FIG. 15B illustrates the mounting portion 1410 of FIG. 15B after it has been machined. As shown, some of the material of ribs 1510 has been machined away creating ridges 1530 lower than the portion of ribs 1510 connected to the sides of upper housing 1286A. The heights and orientations of ridges 1530 may be machined following assembly to ensure that the magnetics components of the magnetics assembly are precisely aligned. Also shown in FIG. 15B is a dowel pin 1540 that has been inserted into a hole formed in dowel pin support structure 1514. Dowel pin 1540 is shown as being formed in the middle of dowel pin support structure 1514. However, it should be appreciated that in some embodiments, the hole formed in dowel pin support structure 1514 for insertion of dowel pin 1540 may be offset from the center of the dowel pin support structure, as needed to ensure a precise alignment of the components of the magnetic assembly.

Figure 16:
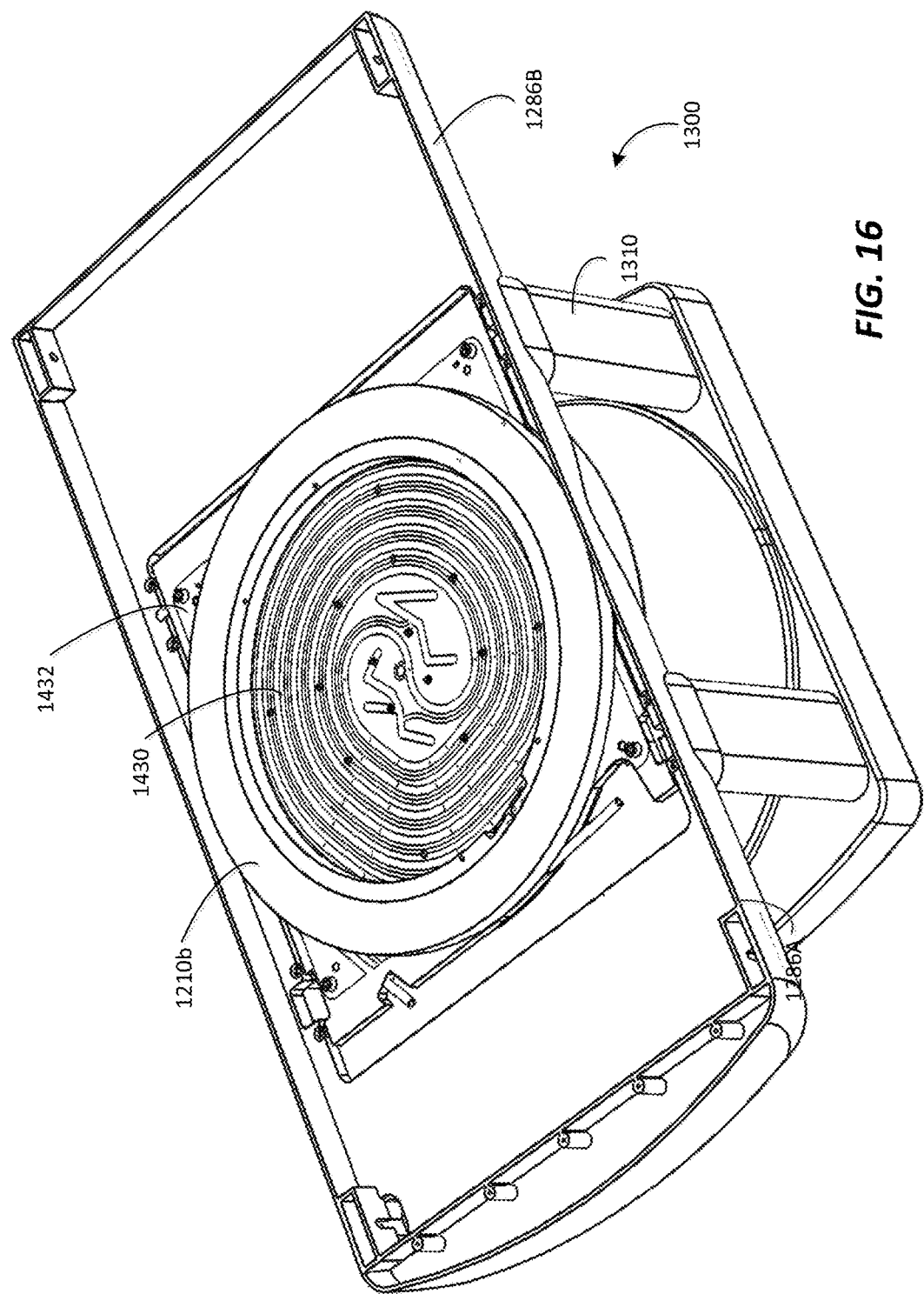
FIG. 16 illustrates an alternate view of the magnetics assembly of FIG. 13.

FIG. 16 illustrates an alternate view of magnet assembly 1300 viewed from below. As shown, lower housing 1286B includes a multi-layer magnetics component comprising a pair of B0 coils (only lower B0 coil 2010b is shown) separated by a thermal management component 1430, examples of which are described above. As shown, thermal management component 1430 includes both a cooling portion adapted to draw heat away from the magnetic components to which it is coupled, and mounting portions 1432, which extend outwardly from the magnetics components to enable the multi-layer magnetics component to be secured to the lower housing 1286B using bolts or any other suitable type of fastener.

Figure 17:
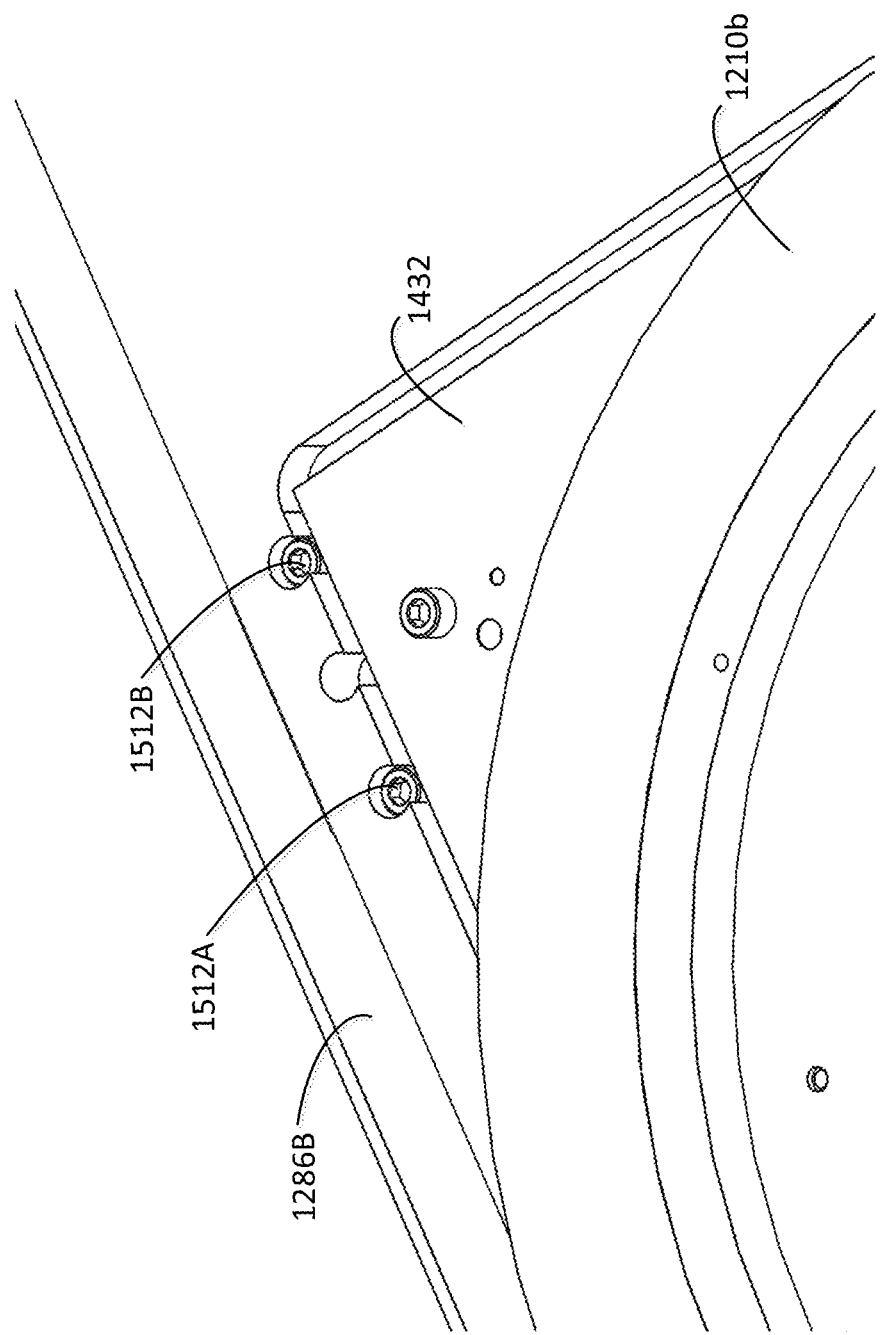
FIG. 17 illustrates a mounting portion of a lower housing of the magnetics assembly shown in FIG. 16.

FIG. 17 illustrates a portion of lower housing 1286B showing a more detailed view of mounting portion 1432 of the thermal management component of the multi-layer magnetics component connected to the magnet assembly. Similar to the connection of the upper multi-layer magnetics component with the upper housing, connection between the lower multi-layer magnetics component with the lower housing may be accomplished using fastener components 1512A and 1512B formed in the mounting portion of the lower housing 1286B.

The exemplary thermal management component described above in connection with FIGS. 1-7 includes a spirally cut conducting substrate within which tubing through which coolant flows is placed to transfer heat away from the magnetics components of the low-field MRI system. The inventors have appreciated that a lower-cost and/or more stable thermal management component may be fabricated by using a molding process rather than machining away material to form the spiral cut grooves, as discussed above. FIGS. 18-23 describe components of a molded thermal management component that may be used in accordance with some embodiments.

Figure 18:
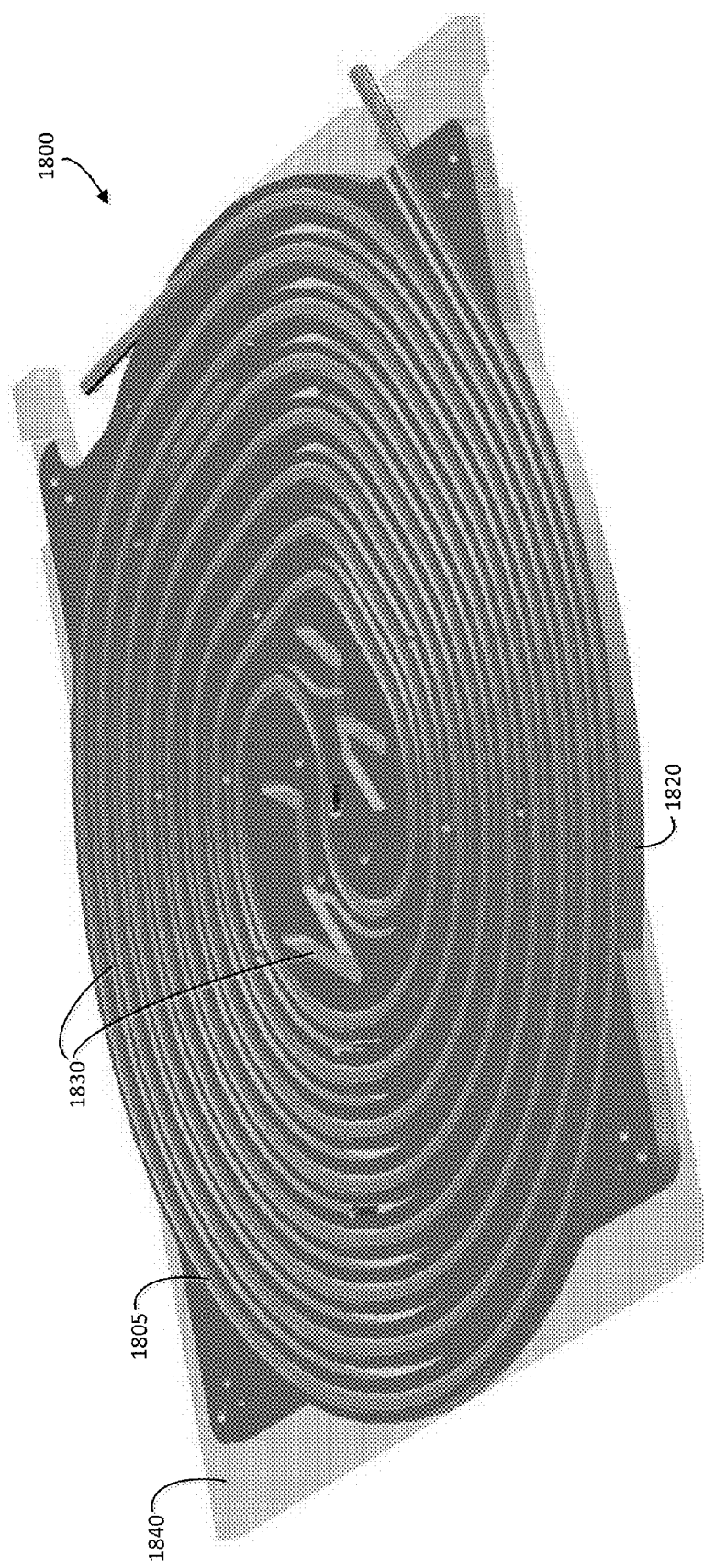
FIGS. 18-23 illustrate components of an alternate thermal management component in accordance with some embodiments.

FIG. 18 shows a thermal management component 1800 comprising a substrate 1820 that has been formed in a mold or cast to include a plurality of grooves 1830 that reduce the size of contiguous portions of the substrate, thereby reducing the formation of eddy currents in the substrate 1820, as discussed above. Conduit 1805 configured to circulate a coolant is also shown affixed to substrate 1820. Conduit 1805 may be affixed to substrate 1820 using any suitable technique including, but not limited to, using a thermally-conductive paste, epoxy, etc. In some embodiments, a groove or trough for the conduit 1805 may be formed in the substrate as a result of the molding process, and thermally-conductive paste may be added to the trough to affix the conduit 1805 to the substrate 1820. The thermally-conductive paste may also reduce or eliminate air gaps between the conduit (e.g., a copper tube) and the substrate (e.g., an aluminum plate), thereby further improving thermal conductivity.

As shown, conduit 1805 is affixed to portions of the substrate between circular grooves 1830 in the substrate that have been introduced into the substrate to reduce or eliminate the formation of eddy currents in the substrate, as discussed above. Conduit 1805 forms two curves in the interior portion of the spiral to enable the entire conduit 1805 to be formed in the same plane. Such a design enables two-sided heat removal and facilitates integration with other magnetics components of the integrated magnetics system, as discussed above.

Thermal management component 1800 also includes overmolding 1840, which provides rigidity to the thermal management component. Overmolding 1840 may comprise a filled polymer, another plastic material, a ceramic material, or any other suitable material. In some embodiments, overmolding 1840 comprises plastic impregnated with an additive such as silver fill, which is thermally conductive and electrically non-conductive. The thermally-conductive additive in overmolding 1840 may provide an effective thermal path from the magnetic components of the integrated magnetics system to the coolant flowing through conduit 1805.

Figure 19:
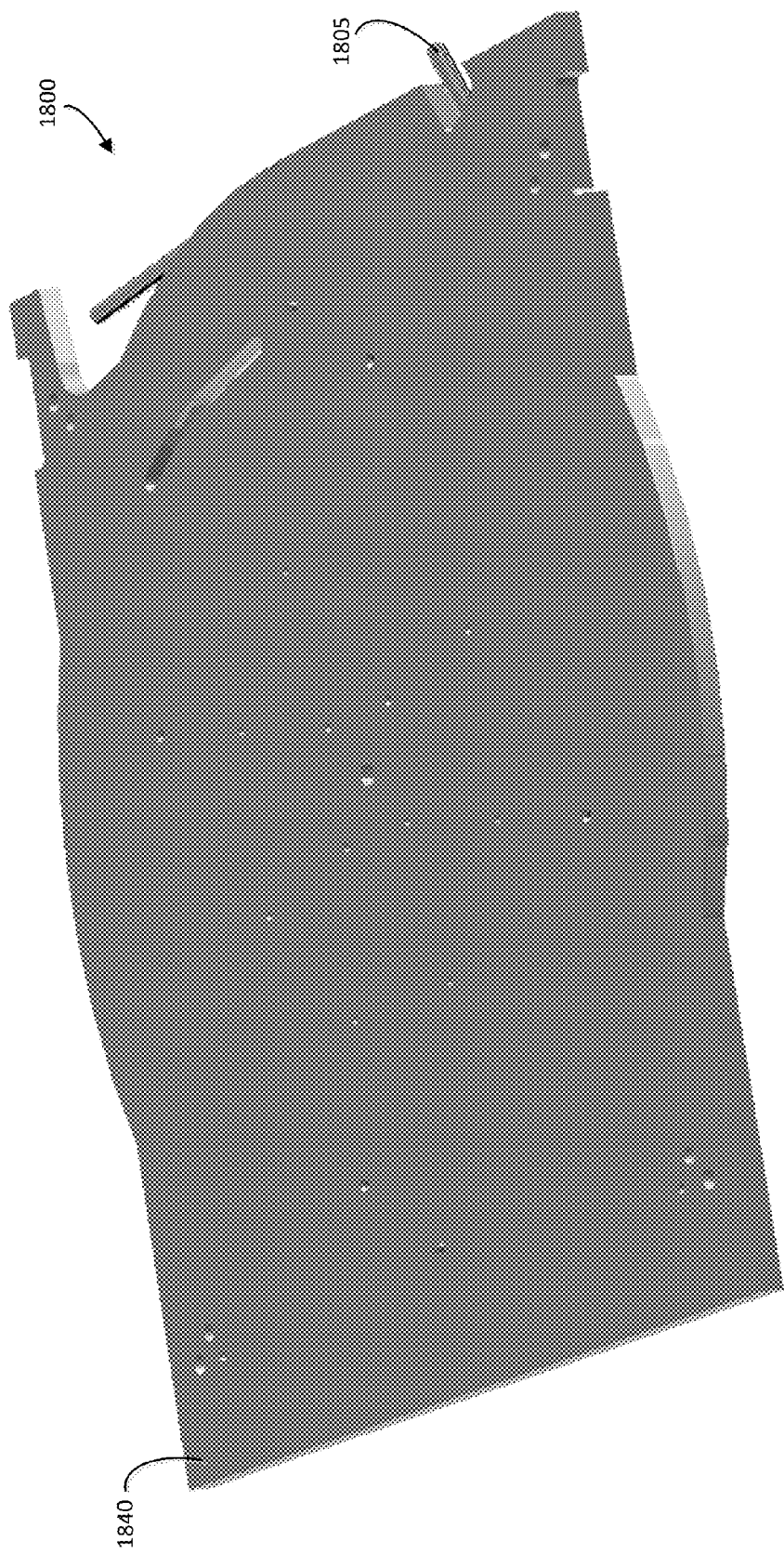
Figure 20:
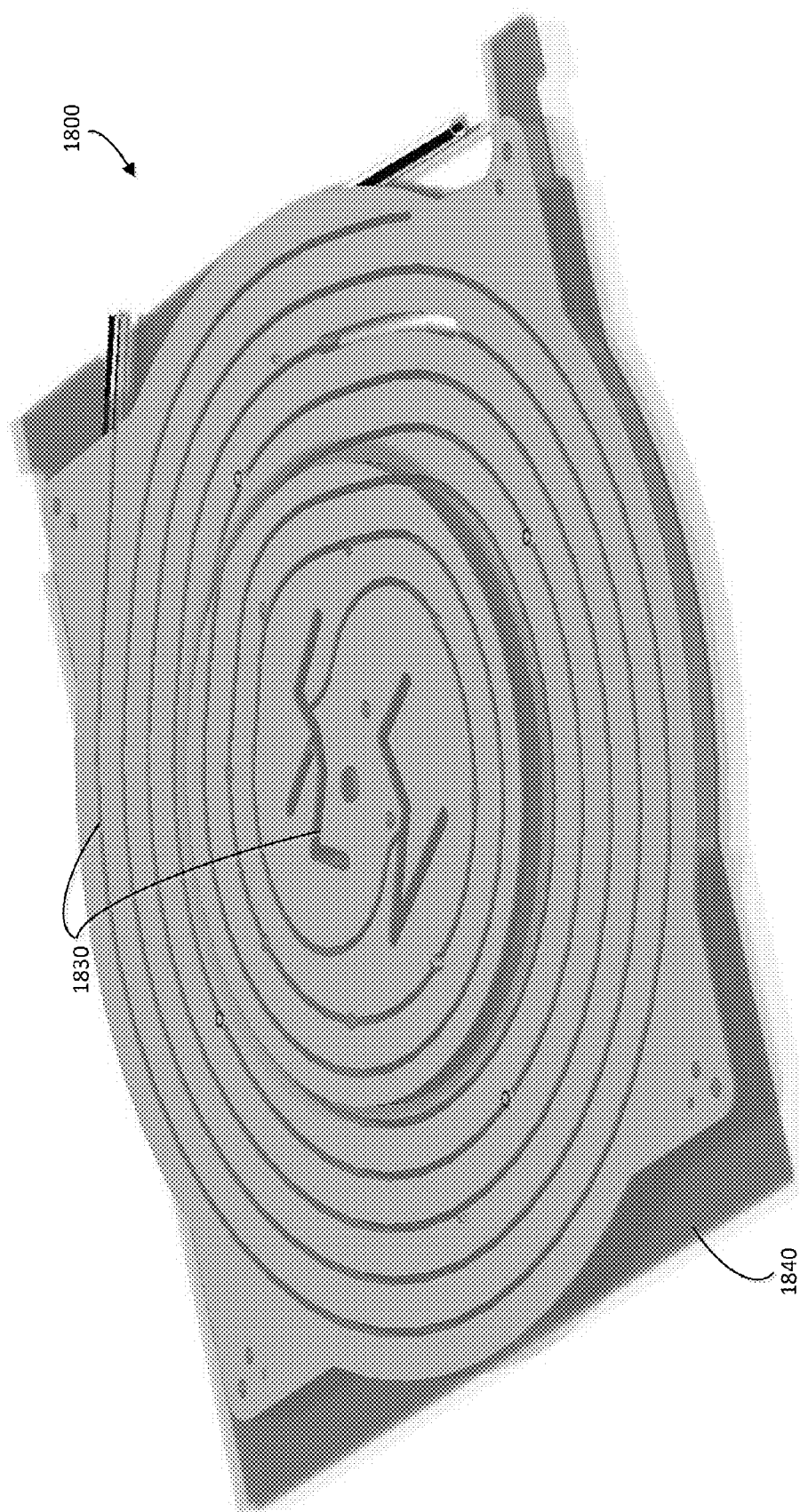
Figure 21:
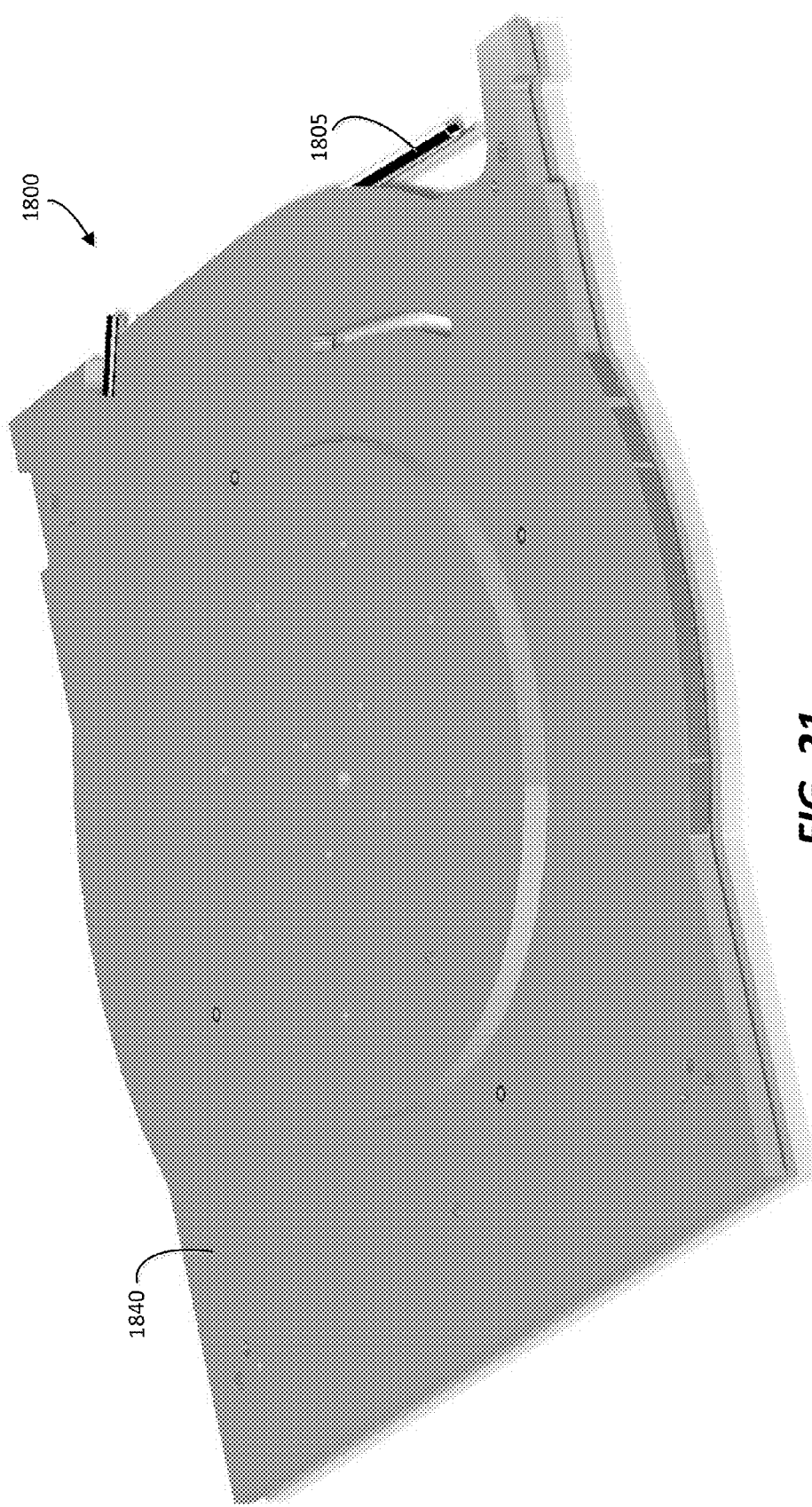

FIG. 19 shows the thermal management component 1800 shown in FIG. 18 on which additional overmolding 1840 has been provided to enclose conduit 1805 within the thermal management component. FIG. 20 shows an alternate view of thermal management component 1800 in which grooves 1830 provided by a molding or casting process are evident. FIG. 21 shows the thermal management component 1800 shown in FIG. 20 on which additional overmolding 1840 has been provided to enclose conduit 1805 within the thermal management component.

Figure 22:
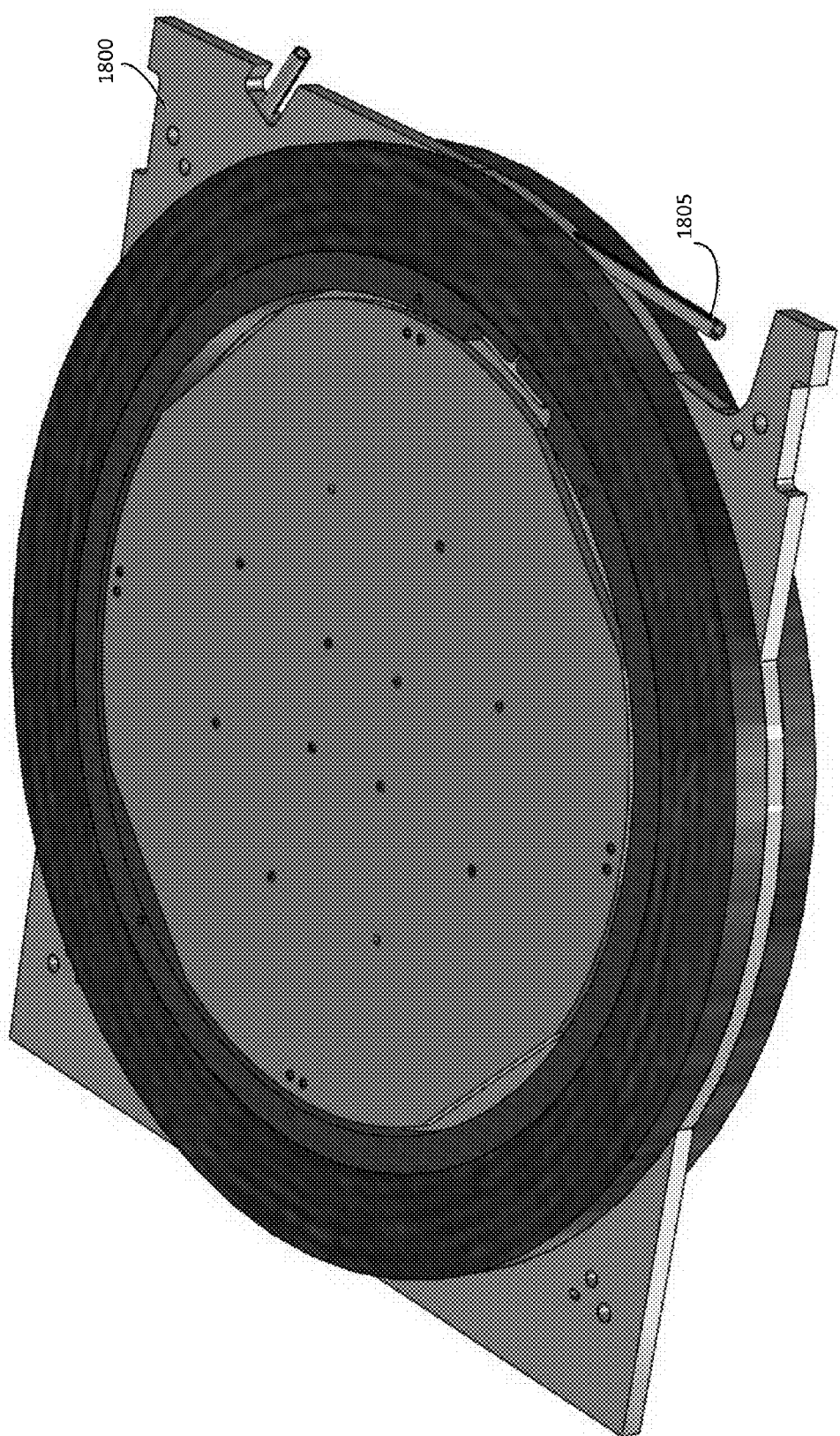
Figure 23:
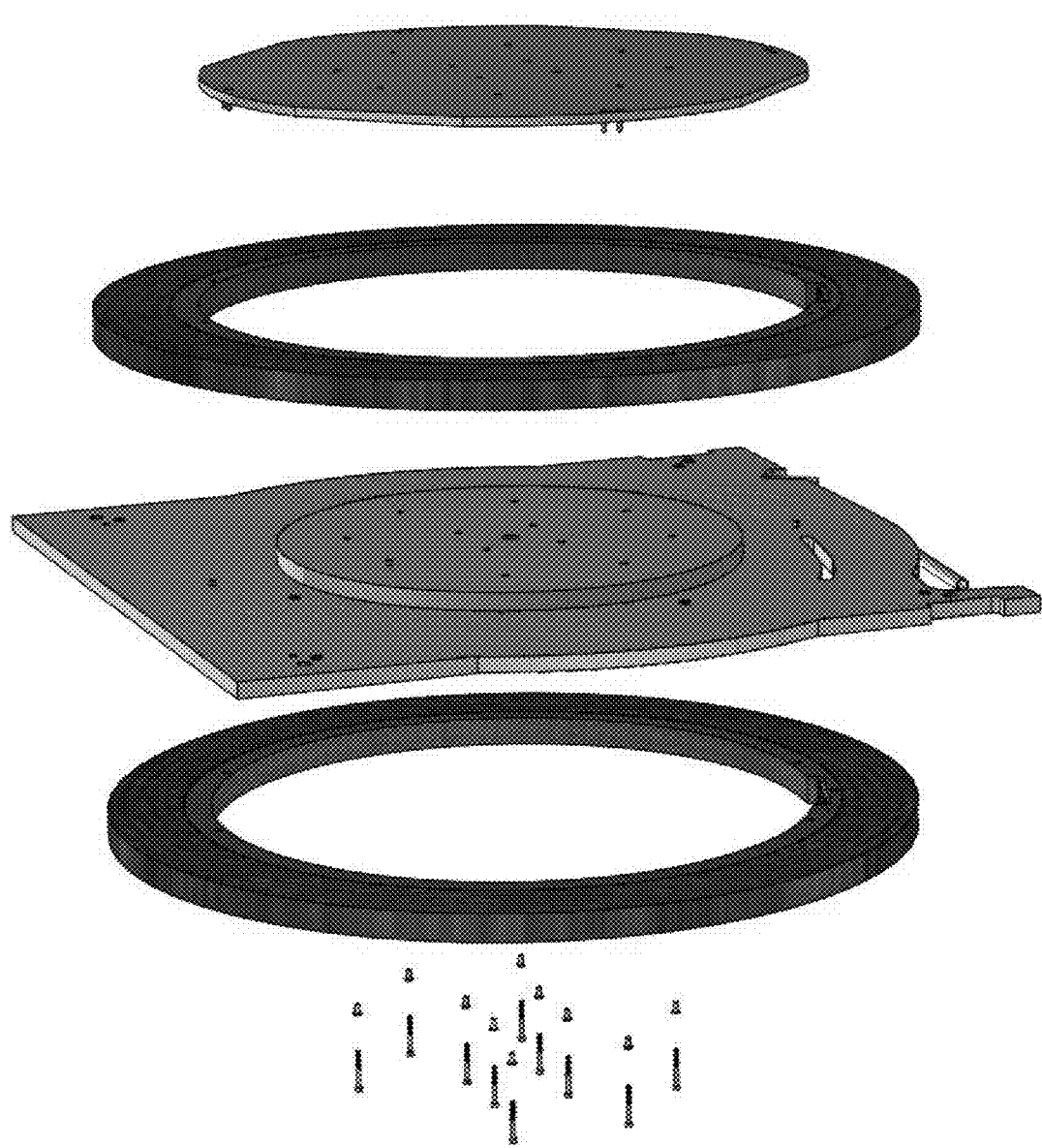

FIG. 22 illustrates thermal management component 1800 integrated with magnetics components of a low-field MRI system, as discussed above. FIG. 23 illustrates an exploded view of the integrated magnetics system shown in FIG. 22.

Having thus described several aspects and embodiments of the technology set forth in the disclosure, it is to be appreciated that various alterations, modifications, and improvements will readily occur to those skilled in the art. Such alterations, modifications, and improvements are intended to be within the spirit and scope of the technology described herein. For example, those of ordinary skill in the art will readily envision a variety of other means and/or structures for performing the function and/or obtaining the results and/or one or more of the advantages described herein, and each of such variations and/or modifications is deemed to be within the scope of the embodiments described herein. Those skilled in the art will recognize, or be able to ascertain using no more than routine experimentation, many equivalents to the specific embodiments described herein. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, kits, and/or methods described herein, if such features, systems, articles, materials, kits, and/or methods are not mutually inconsistent, is included within the scope of the present disclosure.

The above-described embodiments can be implemented in any of numerous ways. One or more aspects and embodiments of the present disclosure involving the performance of processes or methods may utilize program instructions executable by a device (e.g., a computer, a processor, or other device) to perform, or control performance of, the processes or methods. In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other tangible computer storage medium) encoded with one or more programs that, when executed on one or more computers or other processors, perform methods that implement one or more of the various embodiments described above. The computer readable medium or media can be transportable, such that the program or programs stored thereon can be loaded onto one or more different computers or other processors to implement various ones of the aspects described above. In some embodiments, computer readable media may be non-transitory media.

The terms "program" or "software" are used herein in a generic sense to refer to any type of computer code or set of computer-executable instructions that can be employed to program a computer or other processor to implement various aspects as described above. Additionally, it should be appreciated that according to one aspect, one or more computer programs that when executed perform methods of the present disclosure need not reside on a single computer or processor, but may be distributed in a modular fashion among a number of different computers or processors to implement various aspects of the present disclosure.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

When implemented in software, the software code can be executed on any suitable processor or collection of processors, whether provided in a single computer or distributed among multiple computers.

Further, it should be appreciated that a computer may be embodied in any of a number of forms, such as a rack-mounted computer, a desktop computer, a laptop computer, or a tablet computer, as non-limiting examples. Additionally, a computer may be embedded in a device not generally regarded as a computer but with suitable processing capabilities, including a Personal Digital Assistant (PDA), a smartphone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible formats.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

What is claimed is:

1. A thermal management component adapted to cool, when present, at least one component of a magnetic resonance imaging (MRI) system, the thermal management component adapted to reduce or eliminate eddy current production during operation of the MRI system, the thermal management component comprising:
    at least one conduit configured to circulate coolant; and
    at least one thermally-conductive substrate coupled to the at least one conduit and configured to transfer heat from the at least one component to the coolant when circulated through the at least one conduit, wherein the at least one thermally-conductive substrate is configured to reduce or eliminate eddy current production,
    wherein the at least one thermally-conductive substrate is electrically partitioned to reduce eddy current production, wherein the at least one thermally-conductive substrate includes a substantially spiral shaped portion to reduce eddy current production.

2. The thermal management component of claim 1, wherein the at least one thermally-conductive substrate comprises a spiral shaped aluminum cooling plate.

3. The thermal management component of claim 1, wherein the at least one thermally-conductive substrate is electrically partitioned by at least one substantially spiral shaped cut and/or at least one substantially linear shaped cut to partition the at least one thermally-conductive substrate into smaller regions to reduce eddy current production.

4. The thermal management component of claim 1, wherein the at least one conduit is coupled to an upper surface of the at least one thermally-conductive substrate.

5. The thermal management component of claim 1, wherein the at least one conduit is formed within at least a portion of the at least one thermally-conductive substrate.

6. The thermal management component of claim 1, wherein the at least one conduit is provided within at least one respective trough formed in the at least one thermally-conductive substrate.

7. The thermal management component of claim 6, wherein the at least one trough is formed in a spiral shape.

8. The thermal management component of claim 1, wherein the at least one conduit comprises an inlet and an outlet for the coolant and the at least one thermally-conductive substrate comprises a first surface and a second surface configured to thermally couple to the at least one component of the MRI system, and wherein the inlet and the outlet are positioned between the first surface and the second surface to provide a double-sided cooling plate.

9. The thermal management component of claim 8, in combination with the MRI system having at least one first magnetic component and at least one second magnetic component, and wherein the thermal management component is positioned so that the first surface thermally couples to the at least one first magnetic component and the second surface thermally couples to the at least one second magnetic component.

10. The combination of claim 9, wherein the at least one first magnetic component and the at least one second magnetic component operate at two kilowatts or more, and wherein the thermal management component is capable of sufficiently cooling the at least one first magnetic component and the at least one second magnetic component.

11. The thermal management component of claim 9, wherein the at least one first magnetic component and the at least one second magnetic component operate at four kilowatts or more, and wherein the thermal management component is capable of sufficiently cooling the at least one first magnetic component and the at least one second magnetic component.

12. The thermal management component of claim 1, wherein the coolant comprises a liquid or a gas.

13. The thermal management component of claim 1, wherein the at least one thermally-conductive substrate is made from an electrically non-conductive material to eliminate eddy current production.

14. A method of cooling at least one magnetic component of a magnetic resonance imaging (MRI) system adapted to reduce or eliminate eddy current production during operation of the MRI system, the method comprising:
    operating the at least one magnetic component thermally coupled to a thermal management component, the thermal management component comprising at least one thermally-conductive substrate configured to transfer heat away from the at least one magnetic component, wherein the at least one thermally-conductive substrate is configured to reduce or eliminate eddy current production, wherein the at least one thermally-conductive substrate is electrically partitioned to reduce eddy current production, wherein the at least one thermally-conductive substrate includes a substantially spiral shaped portion to reduce eddy current production; and
    circulating coolant through the thermal management component during operation of the at least one magnetic component to transfer heat from the substrate to the coolant.

15. The method of claim 14, wherein the at least one thermally-conductive substrate comprises a spiral shaped aluminum cooling plate.

16. The method of claim 14, wherein the at least one thermally-conductive substrate is electrically partitioned by at least one substantially spiral shaped cut and/or at least one substantially linear shaped cut to partition the at least one thermally-conductive substrate into smaller regions to reduce eddy current production.

17. The method of claim 14, wherein circulating the coolant comprises circulating a coolant through at least one conduit thermally coupled to the substrate.

18. The method of claim 14, wherein circulating the coolant comprises circulating a liquid or a gas.

19. The method of claim 14, wherein the at least one magnetic component is coupled to a first surface of the at least one thermally-conductive substrate and the at least one magnetic component is coupled to a second surface of the at least one thermally-conductive substrate to provide a double-sided cooling plate.

20. The method of claim 14, wherein operating the at least one magnetic component comprises operating at least one $B_0$ coil and at least one gradient coil that, together, operate at two kilowatts or more, and wherein the thermal management component is capable of sufficiently cooling the at least one $B_0$ coil and the at least one gradient coil.

21. The method of claim 14, wherein operating the at least one magnetic component comprises operating at least one $B_0$ coil and at least one gradient coil that, together, operate at four kilowatts or more, and wherein the thermal management component is capable of sufficiently cooling the at least one $B_0$ coil and the at least one gradient coil.

22. The method of claim 14, wherein the at least one thermally-conductive substrate is made from an electrically non-conductive material to eliminate eddy current production.

* * * * *